(12) United States Patent
Tada et al.

(10) Patent No.: US 11,623,247 B2
(45) Date of Patent: Apr. 11, 2023

(54) METHOD FOR PRODUCING PIEZOELECTRIC ELEMENT, AND PIEZOELECTRIC ELEMENT

(71) Applicant: Konica Minolta, Inc., Tokyo (JP)

(72) Inventors: Kazunari Tada, Hachioji (JP); Naoki Shimizu, Hachioji (JP)

(73) Assignee: KONICA MINOLTA, INC., Tokyo (JP)

( * ) Notice: Subject to any disclaimer, the term of this patent is extended or adjusted under 35 U.S.C. 154(b) by 1209 days.

(21) Appl. No.: 16/076,011

(22) PCT Filed: Feb. 15, 2017

(86) PCT No.: PCT/JP2017/005599
§ 371 (c)(1),
(2) Date: Aug. 7, 2018

(87) PCT Pub. No.: WO2017/141996
PCT Pub. Date: Aug. 24, 2017

(65) Prior Publication Data
US 2021/0187550 A1 Jun. 24, 2021

(30) Foreign Application Priority Data
Feb. 8, 2016 (JP) .............................. JP2016-029373

(51) Int. Cl.
*B06B 1/06* (2006.01)
*G01N 29/24* (2006.01)
(Continued)

(52) U.S. Cl.
CPC .......... *B06B 1/0688* (2013.01); *B06B 1/0629* (2013.01); *B06B 1/0666* (2013.01);
(Continued)

(58) Field of Classification Search
CPC ... B06B 1/0688; B06B 1/0666; B06B 1/0622; B06B 1/0629; G01N 29/2437;
(Continued)

(56) References Cited

U.S. PATENT DOCUMENTS 7,518,292 B2 * 4/2009 Matsushita ............. C30B 11/00
252/62.9 PZ
10,737,295 B2 * 8/2020 Morita .................. B06B 1/0629
(Continued)

FOREIGN PATENT DOCUMENTS

CN 1867705 A 11/2006
JP H08-281648 A 10/1996
(Continued)

OTHER PUBLICATIONS

International Search Report for Corresponding Japanese Application No. PCT/JP2017/005599 (dated Apr. 25, 2017) (2 Pages).
(Continued)

*Primary Examiner* — Ryan D Walsh
(74) *Attorney, Agent, or Firm* — Lucas & Mercanti, LLP

(57) ABSTRACT

There is provided a method for producing a piezoelectric element, which allows for forming a columnar microstructure with a small width and a high aspect ratio. The method is intended to produce a piezoelectric element 102 including a three-dimensional structure group 20 having a plurality of the three-dimensional structures 21 and 321 formed in a plate-like or columnar shape with a width of 30 μm or less and a height of 80 μm or more. The production method includes a first process of fabricating a plurality of plate-like or columnar precursor shapes 82a on a bulk material 81 formed of a Pb-based piezoelectric material, and a second process of reducing the width of the precursor shapes 82a to a predetermined value using an etching liquid.

13 Claims, 19 Drawing Sheets

(51) Int. Cl.
*H01L 41/187* (2006.01)
*H01L 41/332* (2013.01)
*H01L 41/338* (2013.01)
*H01L 41/37* (2013.01)
*H04R 31/00* (2006.01)

(52) U.S. Cl.
CPC ..... *G01N 29/2437* (2013.01); *H01L 41/1875* (2013.01); *H01L 41/332* (2013.01); *H01L 41/338* (2013.01); *H01L 41/37* (2013.01); *H04R 31/00* (2013.01); *B06B 1/0622* (2013.01); *Y10T 29/42* (2015.01)

(58) Field of Classification Search
CPC . H01L 41/1875; H01L 41/332; H01L 41/338; H01L 41/37; H04R 31/00; Y10T 29/42
See application file for complete search history.

(56) References Cited

U.S. PATENT DOCUMENTS

| | | | | |
|---|---|---|---|---|
| 2002/0036447 | A1* | 3/2002 | Nagahara | H01L 41/338 29/25.35 |
| 2003/0127949 | A1* | 7/2003 | Nagahara | H01L 41/37 310/334 |
| 2004/0227429 | A1* | 11/2004 | Yin | B06B 1/0622 29/25.35 |
| 2007/0038111 | A1* | 2/2007 | Rehrig | B06B 1/0629 600/459 |
| 2007/0126315 | A1* | 6/2007 | Scott | G06V 40/10 310/318 |
| 2009/0108708 | A1* | 4/2009 | Jiang | H01L 41/37 29/25.35 |
| 2010/0076318 | A1* | 3/2010 | Rehrig | B06B 1/0629 600/466 |
| 2012/0068579 | A1* | 3/2012 | Ichikawa | H03H 3/02 29/25.35 |
| 2014/0221841 | A1* | 8/2014 | Okuda | B06B 1/0677 600/459 |
| 2015/0258583 | A1* | 9/2015 | Korbler | B08B 3/12 367/153 |
| 2016/0027996 | A1* | 1/2016 | Fujii | H01L 41/29 216/13 |
| 2018/0068146 | A1* | 3/2018 | Bai | G06V 40/1329 |
| 2019/0363242 | A1* | 11/2019 | Shimizu | H01L 41/1875 |

FOREIGN PATENT DOCUMENTS

| | | |
|---|---|---|
| JP | 2001-015822 A | 1/2001 |
| JP | 2003-189395 A | 7/2003 |
| JP | 2009-505695 A | 2/2009 |
| JP | 2012-131158 A | 7/2012 |
| JP | 2013-123150 A | 6/2013 |
| JP | 2014-147452 A | 8/2014 |
| JP | 2014-184643 A | 10/2014 |

OTHER PUBLICATIONS

JPO, Office Action for the corresponding Japanese patent application No. 2018-500180, dated Apr. 22, 2020, with English translation.

CNIPA, Office Action for the corresponding Chinese patent application No. 201780012091.2, dated Jun. 3, 2021, with English translation.

Written Opinion of the international Searching Authority dated Apr. 25, 2017 from International Application No. PCT/JP2017/005599 and English translation.

CNIPA, Office Action for the corresponding Chinese patent application No. 201780012091.2, dated Jan. 25, 2022, with English translation.

* cited by examiner

METHOD FOR PRODUCING PIEZOELECTRIC ELEMENT, AND PIEZOELECTRIC ELEMENT

CROSS REFERENCE TO RELATED APPLICATION

This Application is a 371 of PCT/JP2017/005599 filed on Feb. 15, 2017, which, in turn, claimed the priority of Japanese Patent Application No. 2016-029373 filed on Feb. 18, 2016, both applications are incorporated herein by reference.

TECHNOLOGICAL FIELD

The present invention relates to a method for producing a piezoelectric element, and a piezoelectric element available in various ultrasonic application apparatuses for ultrasonic wave measurement, or the like.

BACKGROUND

There exists, for example, a liquid spray head for ink as an ultrasonic application apparatus, and there is known a patterning method of a piezoelectric body film as a method for producing a piezoelectric element part to be embedded in the liquid spray head (see Patent Literature 1). According to the patterning method, there is provided a resist pattern on a piezoelectric body film uniformly formed over a base material, and patterning of the piezoelectric body film is performed by wet etching using an etching liquid containing hydrochloric acid or hydrofluoric acid.

In addition, there is known a method of forming columnar microstructure bodies arranged in a matrix-like two-dimensional array on a PZT substrate, as a method for producing a compound piezoelectric material used for an ultrasonic sensor (see Patent Literature 2). According to the method, a protective film is preliminarily formed on the substrate surface of a hard and brittle material and, after a grooving process has been performed on the substrate from the protective film side with a dicing saw in a first direction at regular intervals, the groove in the first direction is filled with a reinforcement material, and a grooving work is performed with the dicing saw in a second direction perpendicular to the first direction at regular intervals.

However, the methods according to Patent Literatures 1 and 2 do not allow formation of a deep and high columnar microstructure body. In other words, with regard to a hard-to-work piezoelectric material (PZT, PMN-PT, etc.), there has not yet been established a micro machining method of forming a two-dimensional arrangement of a large number of columnar bodies that satisfy a size-related condition such that the aspect ratio (ratio between side and height) is four or more with the length of the short side being in a range of about 5 μm to 30 μm. Specifically, it has been difficult to form, on a piezoelectric material, a group of columnar structure bodies with the length of the horizontal short side being 30 μm or shorter and the height being 80 μm.

For example, with a general wet etching method, which is accompanied by a problem of over-etching or under-etching, it is impossible to form a structure body with an aspect ratio equal to or higher than 1. In addition, it is difficult to chip off an amount equal to or larger than 10 μm by wet etching due to problems such as adhesiveness or durability of the resist.

In contrast, although there is conceivable a method for patterning piezoelectric materials using dry etching, piezoelectric materials such as those described above exhibit difficulty in etching when performing dry etching, which results in an enlarged taper of the structure body obtained by etching and makes it difficult to bore as far as 60 μm or more in the depth direction.

Furthermore, the cutting method using a dicing saw does not allow for cutting down to a minute size equal to or smaller than 30 μm in side width while avoiding damage, due to the hard and brittle nature of the piezoelectric material. Even a successful case of cutting down to a minute size brings about damage such as micro-crack and/or strain, which results in a significant decrease of the piezoelectric constant.

Note that an ideal shape desired for a columnar microstructure body forming a compound piezoelectric body used in an ultrasonic inspection apparatus, for example, is said to be in a range of about 5 μm to 30 μm in diameter or width and in arrangement interval. On the other hand, the transmission and reception efficiency is said to be optimal when the aspect ratio of the columnar microstructure body is approximately 5 to 30. In other words, a height of approximately 25 μm to 900 μm is desired for the columnar or wall-like microstructure body forming the aforementioned compound piezoelectric body.

CITATION LIST

Patent Literature

[Patent Literature 1] Japanese Patent Laid-Open No. 2014-184643
[Patent Literature 2] Japanese Patent Laid-Open No. 8-281648

SUMMARY

It is an object of the present invention, which has been made in view of the aforementioned Background, to provide a method for producing a piezoelectric element which allows formation of a columnar microstructure body with a small width and a high aspect ratio.

In addition, it is an object of the present invention to provide a piezoelectric element having a columnar microstructure body with a small width and a high aspect ratio, and being embedded in various ultrasonic application apparatuses to make highly precise measurement possible.

To achieve the aforementioned object, the method for producing a piezoelectric element reflecting an aspect of the present invention is a method for producing a piezoelectric element including a three-dimensional structure group having a plurality of three-dimensional structures formed in a plate-like or columnar shape with a width of 30 μm or less and a height of 80 μm or more, and the method including a first process of processing a bulk material formed of a Pb-based piezoelectric material into a plurality of plate-like or columnar precursor shapes, and a second process of reducing the width of the precursor shape to a predetermined value using an etching liquid. Here, "fabrication" in the first process refers to mechanical processing excluding chemical etching. In addition, the "width" of the plate-like three-dimensional structure refers to a width in a direction perpendicular to the main surface or plate surface. In addition, the "height" of the three-dimensional structure refers to a size in a direction which is perpendicular to the direction of the aforementioned width and in which an electric field is applied as a piezoelectric element.

To achieve the aforementioned object, the piezoelectric element reflecting an aspect of the present invention is a piezoelectric element including a three-dimensional structure group having a plurality of three-dimensional structures formed in a plate-like or columnar shape, and a filling part that fills the gap in the three-dimensional structure group, the piezoelectric element being embedded in a probe of an ultrasonic inspection apparatus, and the surface of the three-dimensional structure, which is contacting the filling part, being a surface finished by wet etching.

DETAILED DESCRIPTION OF EMBODIMENTS

First Embodiment

In the following, a method for producing a piezoelectric element of a first embodiment according to the present invention will be described, referring to drawings.

Figure 1:
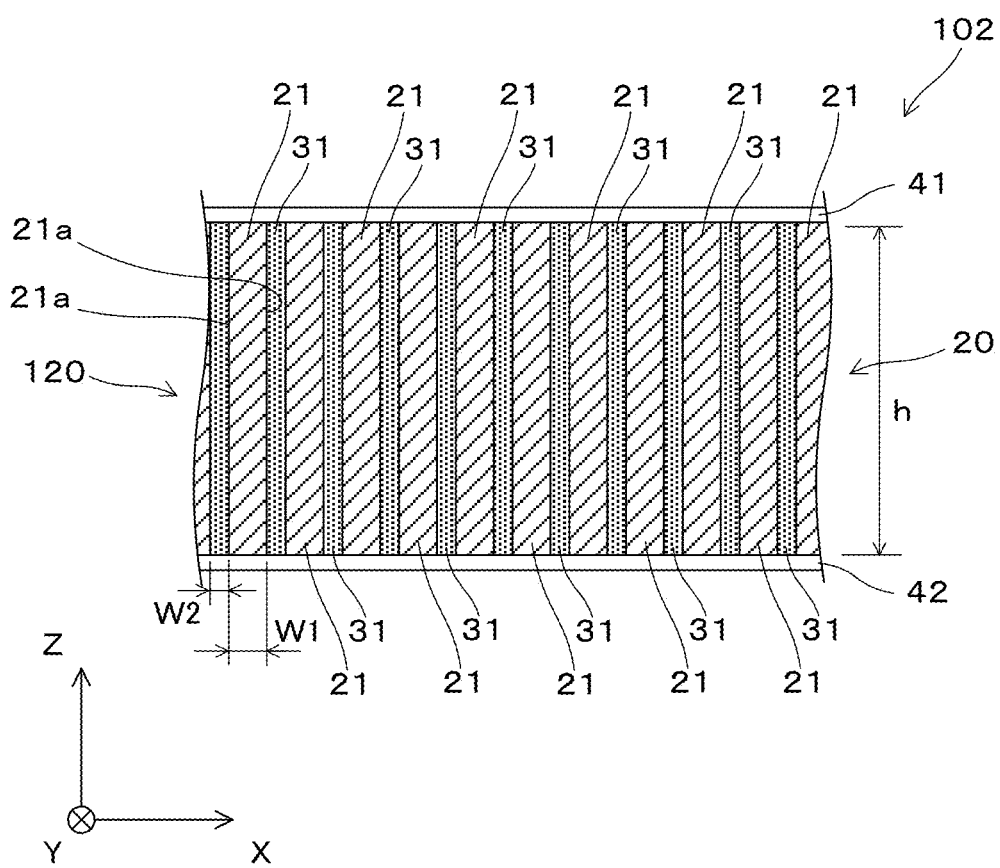
FIG. 1 is an enlarged cross-sectional view explaining a piezoelectric element obtained by a production method of a first embodiment.
Figure 2A:
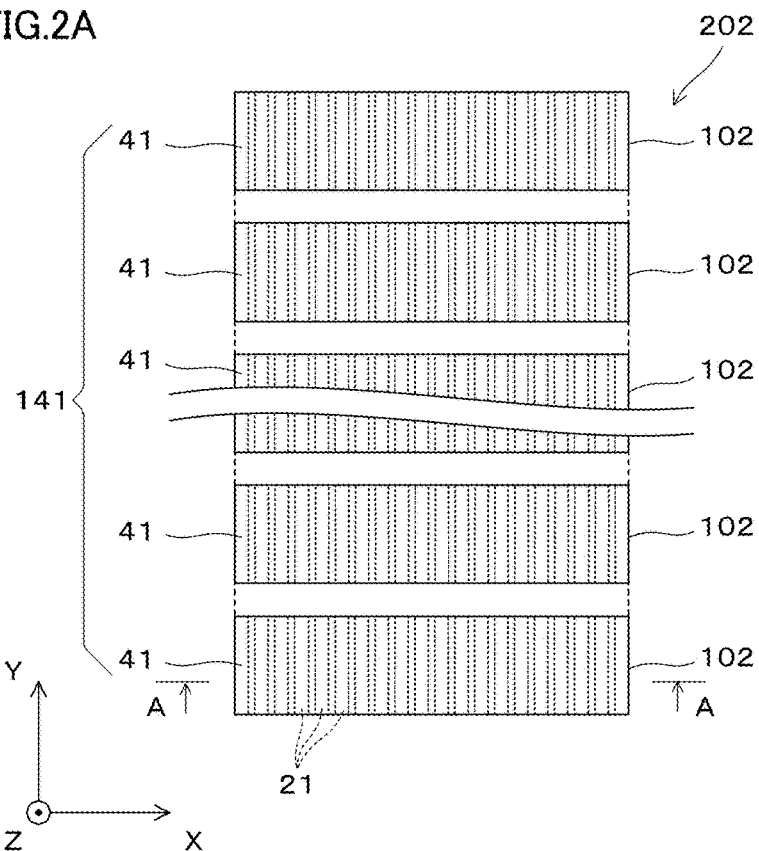
FIGS. 2A to 2C are, respectively, a plan view explaining the entire structure of the piezoelectric element, a cross-sectional view seen from the direction of two arrows A, and a side view.
Figure 2B:
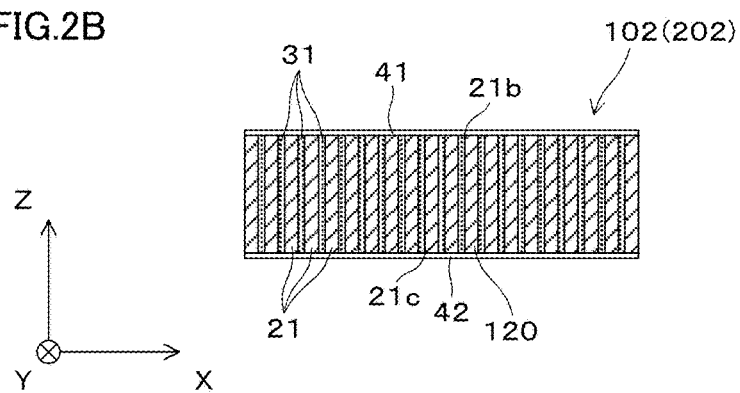
Figure 2C:
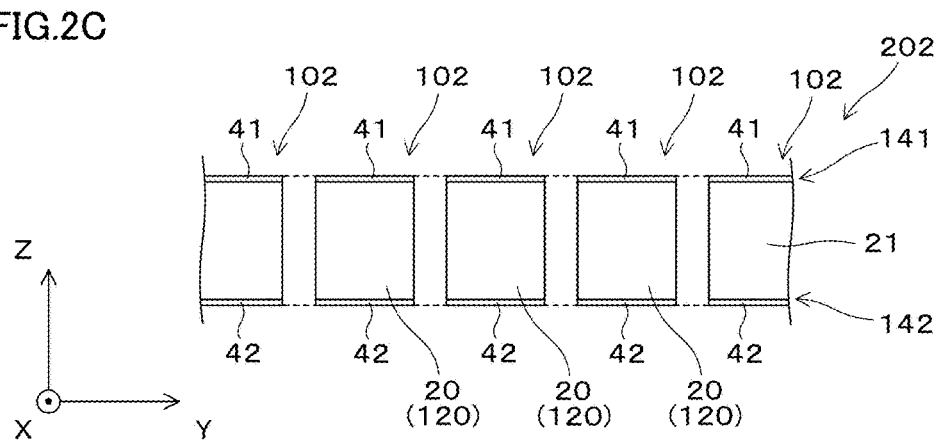

FIG. 1 is an enlarged cross-sectional view of a componential piezoelectric element obtained by the production method of a first embodiment, and FIGS. 2A to 2C are a plan view, a cross-sectional view, or the like explaining an element assembly combining a plurality of piezoelectric elements illustrated in FIG. 1.

As illustrated in FIG. 1, a piezoelectric element 102 as a single piece includes a periodic three-dimensional structure group 20 formed of a piezoelectric material, a large number of filling parts 31 filling the gaps in the three-dimensional structure group 20, a first electrode 41 provided on one side of the three-dimensional structure group 20, and a second electrode 42 provided on the other side of the three-dimensional structure group 20. Here, a combination of the three-dimensional structure group 20 and the filling parts 31 filling the gaps is referred to as a compound piezoelectric element body 120. The compound piezoelectric element body 120 is a cuboid-like or plate-like member having a rectangular outline which is relatively long in the X-direction on the XY plane and thin in the Z-direction.

The element assembly 202 illustrated in FIGS. 2A to 2C, formed by a large number of piezoelectric elements 102 respectively having a structure illustrated in FIG. 1 arranged in close proximity to each other in the Y-direction, is a piezoelectric element in a broad sense, and the element assembly 202 may also be referred to as a piezoelectric element in the present description. Individual piezoelectric elements 102 included in the element assembly 202 are fixed so as to maintain their mutual positional relation by a supporting member which is not illustrated.

The three-dimensional structure group 20, among the piezoelectric elements 102, is formed of a Pb-based piezoelectric material such as PMN-PT, PZT, or the like (including, for example, PMNT, PIMNT, PSMNT). Here, PMN-PT, formed of $PbO$—$MgO$—$Nb_2O_5$—$TiO_2$, includes, for example, 69.9 to 70.6 mass % lead oxide, 2.5 to 3.1 mass % magnesium oxide, 16.8 to 20.3 mass % niobium oxide, and 6.7 to 10.1 mass % titanium oxide. The three-dimensional structure group 20 has a structure in which a large number of three-dimensional structures 21 formed in a thin-plate-like or wall-like shape are arranged in one direction in a laminated manner. A large number of the three-dimensional structures 21 expand in a thin-plate-like shape in the depth-wise Y-direction and the vertical Z-direction, and are also arranged at generally regular intervals in the X-direction. Each of the three-dimensional structures 21 has a generally identical shape and, when seen as cross section parallel to the Y-Z plane, has a rectangular outline which is close to a square.

The three-dimensional structures 21 have a width (also referred to as lateral width) W1 of 30 μm or less in the cross section parallel to the X-Z plane, and a height (also referred to as depth) h of 80 μm or more in the cross section parallel to the X-Z plane. In a specific example, the width W1 is set to about 5 to 30 μm, for example, and the height h is set to about 100 to 300 μm, for example. Note that, although the interval W2 (i.e., the thickness of the individual filling parts 31) between adjacent three-dimensional structures 21 is not limited in particular, it is set to about 1 to 30 μm, for example, for convenience of subsequent steps.

Each of the three-dimensional structures 21 has been finished by wet etching. In other words, a side surface 21a contacting the filling part 31 of the three-dimensional structures 21, which is a surface subjected to wet etching, turns out to be a smooth surface. Accordingly, the side surface 21a of each of the three-dimensional structures 21 has neither any minute scratches such as those occurring immediately after fabrication using a dicing saw, nor any adhesion of re-deposition film such as when being formed by dry etching, and it is approximately perpendicular without tapering.

The filler filling part 31, which is formed of epoxy resin, for example, forms the compound piezoelectric element body 120 integrally with a large number of the three-dimensional structures 21, while securing isolation and insulation characteristics with respect to ultrasonic waves among the individual three-dimensional structures 21. A large number of the three-dimensional structures 21 are supported by the filling parts 31 via the side surface 21a. Each of the three-dimensional structures 21 is electrically independent of an adjacent three-dimensional structure 21 due to existence of the filling part 31, thereby being in a state where ultrasonic interaction is difficult to occur.

As illustrated in FIGS. 2A to 2C, a group of the first electrodes 41 in the element assembly 202 is a conductive metal film extending in the X-direction along a top surface 21b of a large number of the compound piezoelectric element bodies 120, forming a comb-like electrode 141 as a whole. Similarly, a group of the second electrodes 42 is also a conductive metal thin film extending in the X-direction along a bottom surface 21c of a large number of the compound piezoelectric element bodies 120, forming a comb-like electrode 142 as a whole.

Note that the compound piezoelectric element bodies 120 and the first and the second electrodes 41 and 42 sandwiching them exist in the Y-directions for as many as 192 channels, for example, and the compound piezoelectric element bodies 120 of the 192 channels independently receive drive signals, for example. In other words, each of the piezoelectric elements 102 is supplied thereto individual drive signals at different timings or the like.

In the following, a method for producing the piezoelectric elements 102 illustrated in FIG. 1A or the like will be described, referring to FIG. 3 and FIGS. 4 to 6.

Figure 3:
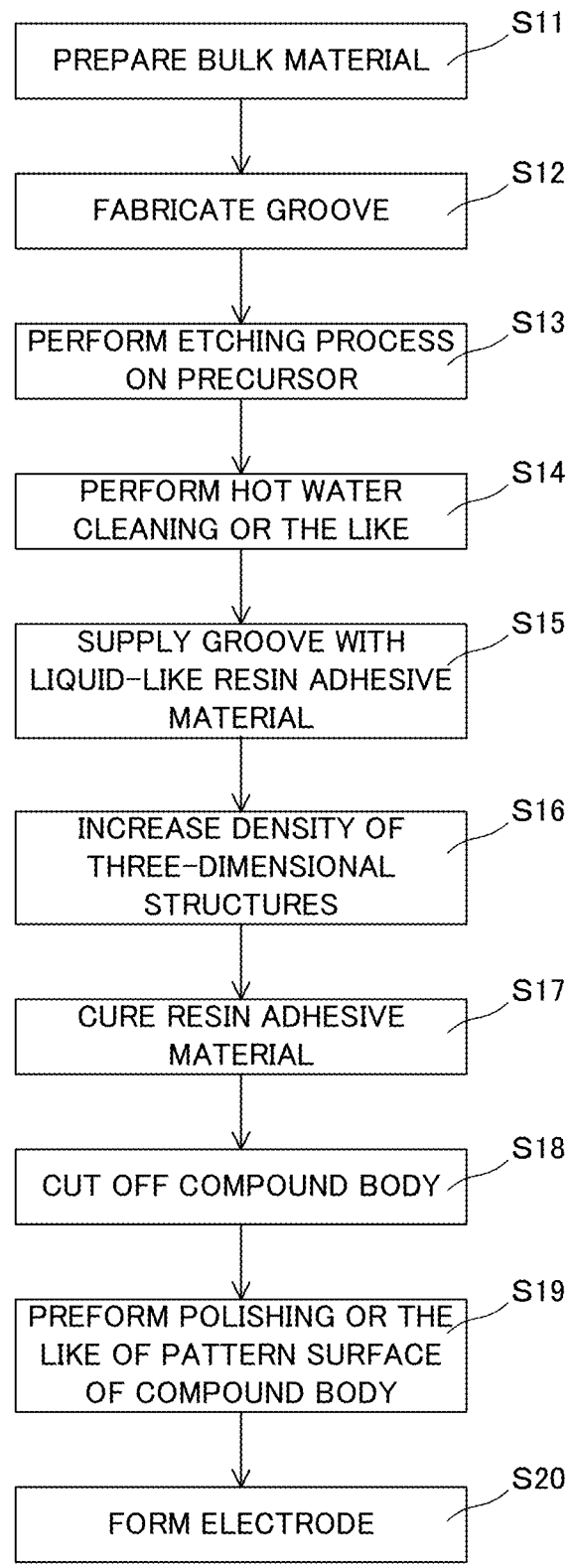
FIG. 3 is a conceptual flowchart explaining production steps of the piezoelectric element of FIG. 1.
Figure 4A:
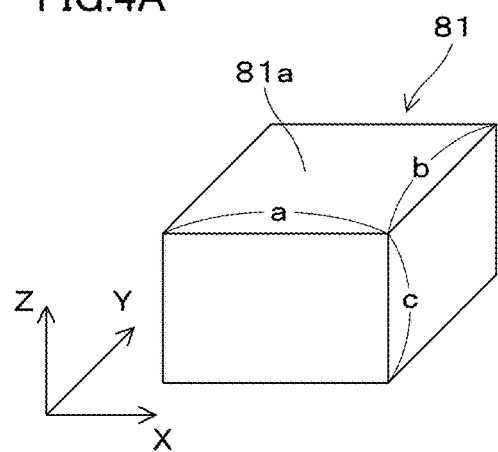
FIGS. 4A to 4D are conceptual perspective views explaining the steps for obtaining a precursor by grooving.

First, there is prepared (step S11 of FIG. 3) a plate-like bulk material 81 formed of PMN-PT (see FIG. 4A). The size of the bulk material 81 is defined as: a×b×c=20 mm×20 mm×0.5 mm, for example, with "a" denoting the lateral length, "b" denoting the vertical length or the depth length, and "c" denoting the thickness. In the bulk material 81, the main surface 81a of a×b which is parallel to the X-Y plane turns out to be the (001) plane.

Figure 4B:
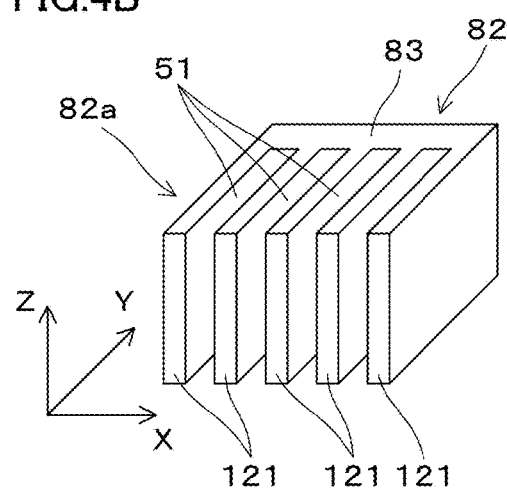

Next, as illustrated in FIG. 4B, a large number of grooves 51 having a uniform width and extending in the Y-direction and the Z-direction are fabricated on the bulk material 81 at regular intervals by cutting in parallel (step S12 of FIG. 3, i.e., the first process). Accordingly, a bundle-like precursor 82 having a large number of micro shapes 121 is obtained. A groove 51, which is fabricated by cutting the bulk material 81 using a dicing saw (fabrication tool), has a groove width or interval of 25 μm, for example. In addition, the groove 51 is formed with a spatial period or pitch of 75 μm, for example, in the X-direction. The plate-like or wall-like micro shape 121 remaining between a pair of adjacent grooves 51, which is a part supposed to become the three-dimensional structures 21 by subsequent fabrication, has a width of 50 μm in the X-direction and a depth length of about 15 mm. A large number of the micro shapes 121, being precursor shapes 82a provided on the precursor 82, are joined at a root part 83 so that it may easily bend at the tip. The precursor shapes 82a are formed to have a width of 80 μm or less and a height of 80 μm or more. By setting the aforementioned range, it becomes easy to make the three-dimensional structure group 20 or the piezoelectric elements 102 suitable for use in an ultrasonic inspection apparatus. The precursor shapes 82a are left by cutting the bulk material 81 in the aforementioned first process. When cutting the bulk material 81, it becomes easy to form, as the precursor shape 82a, a plate-like or standing-wall-like microstructure or the like extending vertically from a base part. Note that, when forming the groove 51, dicing may be performed with a dress board being provided adjacent to the bulk material 81. In such a case, the dicing saw may be polished while fabricating the groove using the dicing saw.

Note that, although a small number of micro shapes 121 are illustrated in FIG. 4B for convenience of explanation, actually about 30 or less micro shapes 121 are formed as the precursor shapes 82a. Furthermore, the bulk material 81 is divided into, for example, about five pieces of the precursor 82 in the X-direction. In other words, there are obtained about five pieces of the precursor 82 as a minimum unit, each having about 30 or less micro shapes 121 formed thereon. In such a case, each piece of the precursor 82 turns out to have a size of about (a/5)×b×c.

Figure 4C:
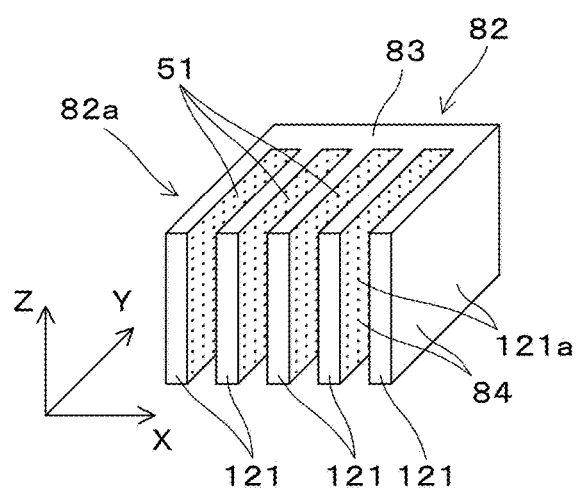

Next, as illustrated in FIG. 4C, the precursor 82 is immersed into an etching liquid containing at least one of fluoride, chloride, and nitric acid, and starts wet etching of the micro shapes 121 (step S13 of FIG. 3). The wet etching allows the width or interval of each of the grooves 51 to be enlarged. As the etching liquid, ammonium fluoride, nitric acid or hydrochloric acid, or any mixed liquid thereof may be used. In addition, any other liquid containing fluorine, chlorine, or nitric acid ions may be used. Preferably, it is desirable to use ammonium fluoride and nitric acid for suppressing debris. Ammonium fluoride causes any material other than lead to dissolve, but lead being a passive material (lead fluoride) does not dissolve, and therefore it is desirable to mix a small amount of nitric acid in order to immediately dissolve the passive material (referred to as passive body in the following). Using such etching liquid makes it easy to perform stable etching on the surface of Pb-based piezoelectric material to be fabricated, and relatively easy to maintain the shape of the micro shapes 121. Note that, when using a liquid containing ammonium fluoride and nitric acid as the etching liquid, 3 to 10 mass % ammonium fluoride and 1 to 10 mass % nitric acid are preferred.

Figure 7:
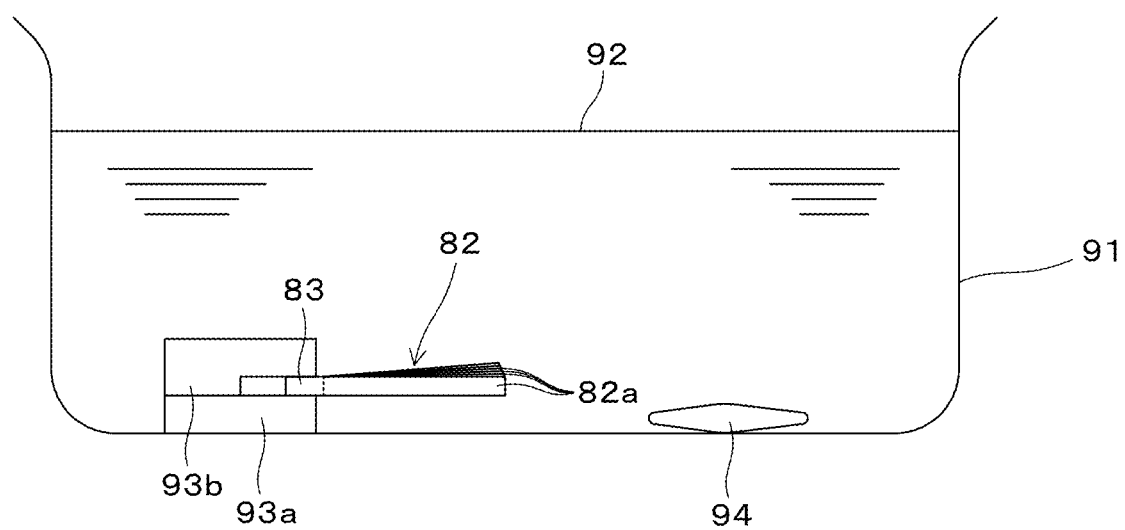
FIG. 7 is an explanatory diagram of a wet etching process on the precursor.

FIG. 7 is an explanatory diagram of a wet etching process of the precursor 82. The precursor 82 is placed in a container 91, and the container 91 is filled with an etching liquid 92 at a predetermined temperature. The container 91 is preferred to be a glass-made petri dish as will be described below, since it is difficult to maintain the precursor shape with a container made of plastic or polytetrafluoroethylene. On this occasion, the root part 83 of the precursor 82 is supported in a manner sandwiched by glass-made supporting members 93a and 93b, for example. Furthermore, during etching, the etching liquid 92 is stirred with a rotor 94, while maintaining the temperature of the etching liquid 92 by a temperature regulator which is not illustrated. Here, it is desirable to use an item formed of a material such as borosilicate glass, lead glass, soda quartz glass, or the like, as the container 91 or the supporting members 93a and 93b. Accordingly, it becomes easy to maintain the micro shape 121. In more detail, causing the glass to contact the etching liquid simultaneously when performing etching allows for changing only the size of precursor shape 82a without deformation. Even when the precursor shape 82a has been produced, there is a tendency with dissolving by an etching liquid that the precursor shape 82a is not maintained and dissolves in a collapsing manner. However, processing while simultaneously dissolving the glass component makes it easy to change only the size of the precursor shape 82a while maintaining the shape thereof.

Figure 4D:
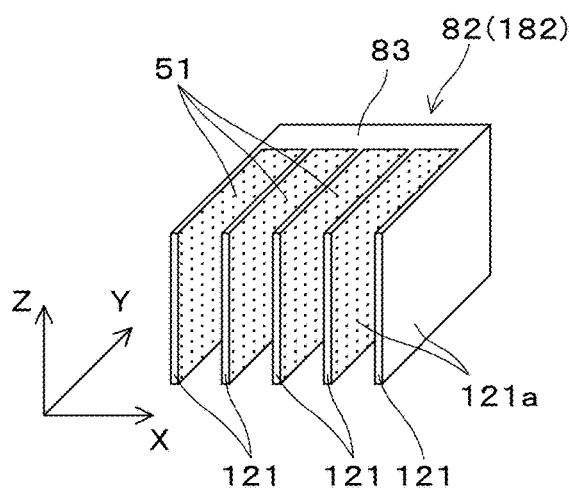

Next, as illustrated in FIG. 4D, wet etching is stopped at a stage when the thickness of the micro shape 121 has reached a target value, and there is performed hot-water cleaning or acetone cleaning, or a combination of either one thereof and ultrasonic cleaning, $O_2$ plasma cleaning, or the like (step S14 of FIG. 3). Accordingly, an etched product 182 having an improved adhesiveness with epoxy resin can be obtained (see FIG. 5A). The etched product 182 has a large number of the thin-plate-like or wall-like three-dimensional structures 21 formed thereon in a manner uniformly arranged in proximity to each other. The foregoing steps S13 and S14 are included in the second process. Step S13 is the main part of the second process and step S14 is a finishing part of the second process.

Note that, as a result of examining the components of a passive layer 84 (see FIG. 4C) formed in a specific production example in a case where a mixed liquid of ammonium fluoride and hydrochloric acid was used as the etching liquid, it was found that the content was about ½ Pb, about ¼ F, about ¼ Cl, and about 1/20 Nb. Since the original composition of the precursor 82 contains about ½ Pb, about ¼ Mg, about ¼ Nb, and 1/20 or less Nb, it has been found that major components of the passive layer 84 are lead chloride and lead fluoride. Therefore, it is conceivable that performing hot water or diluted nitric acid cleaning, ultrasonic cleaning, or a combination thereof, for example, makes it possible to remove only the passive layer 84. Specifically, the passive layer 84 can be removed by being immersed into hot water of 70° C. to 90° C. for several tens of minutes to several hours, and reliably removed by adding ultrasonic cleaning. Additionally, in a case where a mixed liquid of ammonium fluoride and nitric acid was used as the etching liquid, etching was smoothly performed without forming the passive layer 84, and therefore it is desirable to use ammonium fluoride and nitric acid in order to suppress formation of passive bodies.

Figure 5A:
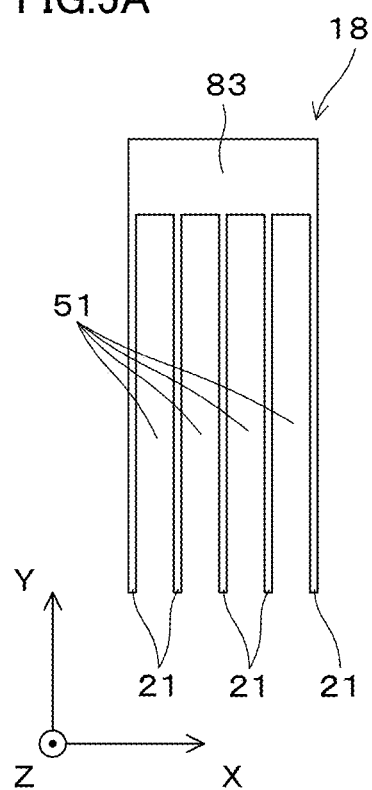
FIGS. 5A to 5E are conceptual views explaining steps for obtaining a compound body from the precursor.
Figure 5B:
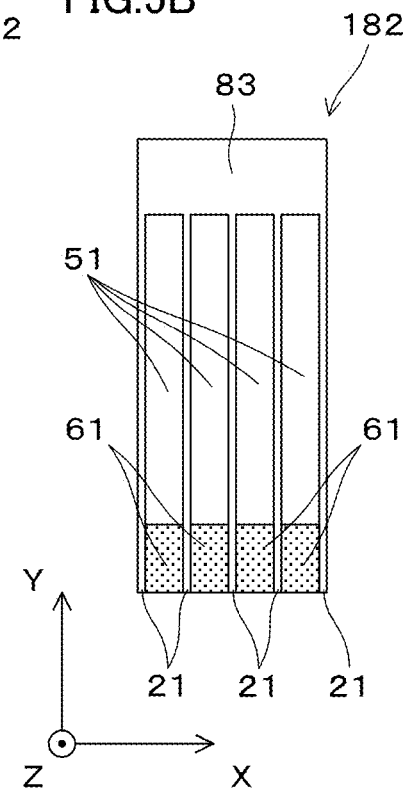

Next, as illustrated in FIG. 5B, a resin adhesive material 61 is supplied by coating or other approaches on the tip side of a group of the three-dimensional structures 21 provided on the etched product 182 (step S15 of FIG. 3). In other words, the resin adhesive material 61, which is a resin having a predetermined viscosity, is filled between the plurality of the three-dimensional structures 21, and the interval between the plurality of three-dimensional structures 21 is adjusted. Accordingly, the interval between a plurality of the three-dimensional structures 21 can be narrowed to a desired degree using the viscosity of the resin. In addition, the intervals between a plurality of the three-dimensional structures 21 is adjusted using surface tension that occurs in accordance with the viscosity of the resin. Accordingly, intervals between a plurality of the three-dimensional structures 21 are set and semi-automatically aligned to a value in accordance with the viscosity of the resin. As the resin adhesive material 61, epoxy resin may be used, for example.

Figure 5C:
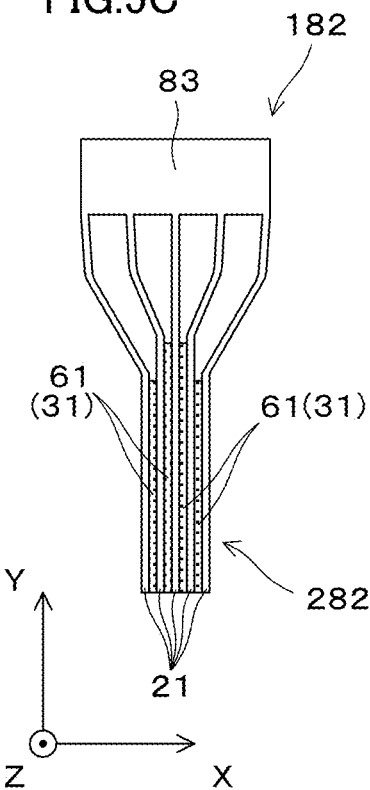

Note that the micro shapes 121 are thin and easy-to-bend, the tip of which may be deformed in parallel, while being bent at the root. In such a state, leaving the etched product 182 as it is, or sandwiching the group of three-dimensional structures 21 with appropriate pressure force causes the resin adhesive material 61 to spread all over the entire surface due to surface tension, and also to converge to and stabilize at a thickness determined by the surface tension and the viscosity of the epoxy, as illustrated in FIG. 5C. As a result, the thickness of the resin adhesive material 61 becomes thin, or the interval between the three-dimensional structures 21 becomes narrow so that the density of the three-dimensional structures 21 increase (step S16 of FIG. 3). Subsequently, the resin adhesive material 61 between the three-dimensional structures 21 is cured (step S17 of FIG. 3). Accordingly, it is possible to realize a state where the group of three-dimensional structures 21 having the filling part 31 including the resin adhesive material 61 sandwiched therebetween are arranged and fixed at generally regular intervals. The part in which the three-dimensional structures 21 and the filling parts 31 are alternately laminated is referred to as a compound body 282. On this occasion, adjusting the proportion of the adhesion component or solvent included in the resin adhesive material 61 allows for adjusting the viscosity and surface tension of the resin adhesive material 61, and adjusting the thickness of the resin adhesive material 61 (i.e., the filling part 31) at the time of curing.

Figure 5D:
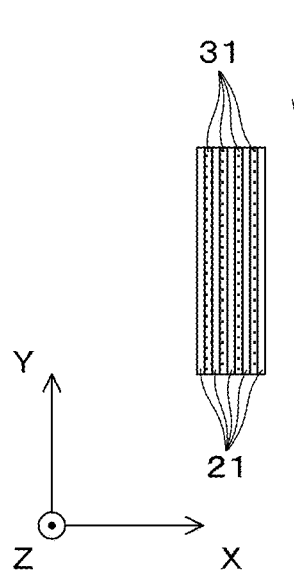
Figure 5E:
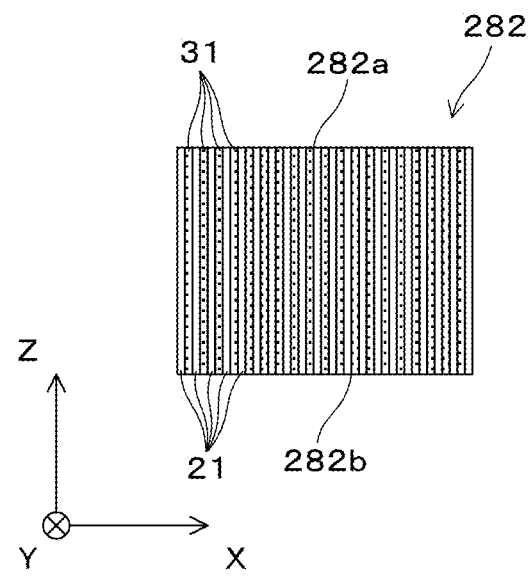

Subsequently, as illustrated in FIG. 5D, the compound body 282 having the three-dimensional structures 21 and the filling part 31 alternately laminated therein is cut off from other parts including the root part 83 or the like by dicing (step S18 of FIG. 3). The obtained compound body 282 actually includes about 30 pieces of the three-dimensional structures 21, and therefore has a sufficient thickness in the lamination direction or the X-direction, as illustrated in FIG. 5E. The number of the three-dimensional structures 21 laminated turns out to correspond to the number of the micro shapes 121 forming the precursor 82, and when it is desired to further increase the number of lamination, a plurality of compound bodies 282 are joined in the lamination direction, making the compound body 282 as the minimum unit.

Subsequently, polishing or grinding is performed on the obtained compound body 282 to adjust the thickness in the Z-direction, and the pattern surfaces 282a and 282b at ±Z sides are planarized (step S19 of FIG. 3). The thickness of the compound body 282, which is adjusted in accordance with the frequency of ultrasonic wave, is usually in a range from 80 µm to 500 µm. Accordingly, it is possible to obtain the compound piezoelectric element body 120 including the three-dimensional structures 21 or the three-dimensional structure group 20 exposing the (001) plane as the top surface 21b and the bottom surface 21c (see FIG. 6A).

Figure 6A:
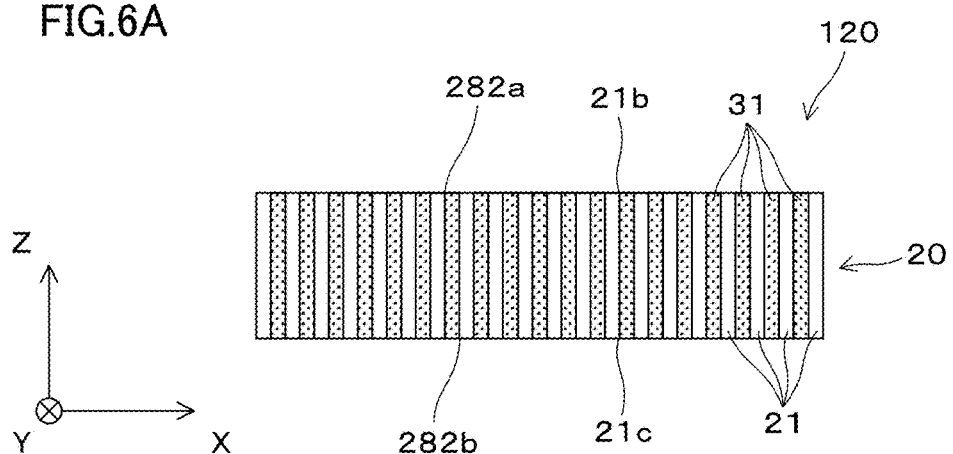
FIGS. 6A to 6C are conceptual views explaining steps for obtaining a piezoelectric element or an element assembly from the compound body.
Figure 6B:
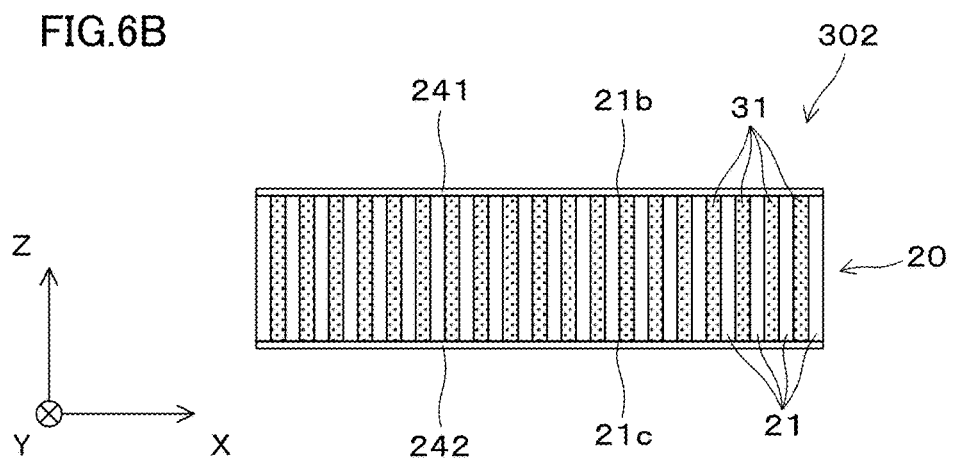

Next, a piezoelectric element parent material 302 is completed by forming a first electrode layer 241 which turns out to be the first electrode 41 and a second electrode layer 242 which turns out to be the second electrode 42 sequentially on the top surface 21b and the bottom surface 21c (step S20 of FIG. 3), among the pattern surfaces 228a and 228b (see FIG. 6B). Both of the electrodes layers 241 and 242 are conductive film of Cr/Au, for example, and formed by sputtering, for example.

Figure 6C:
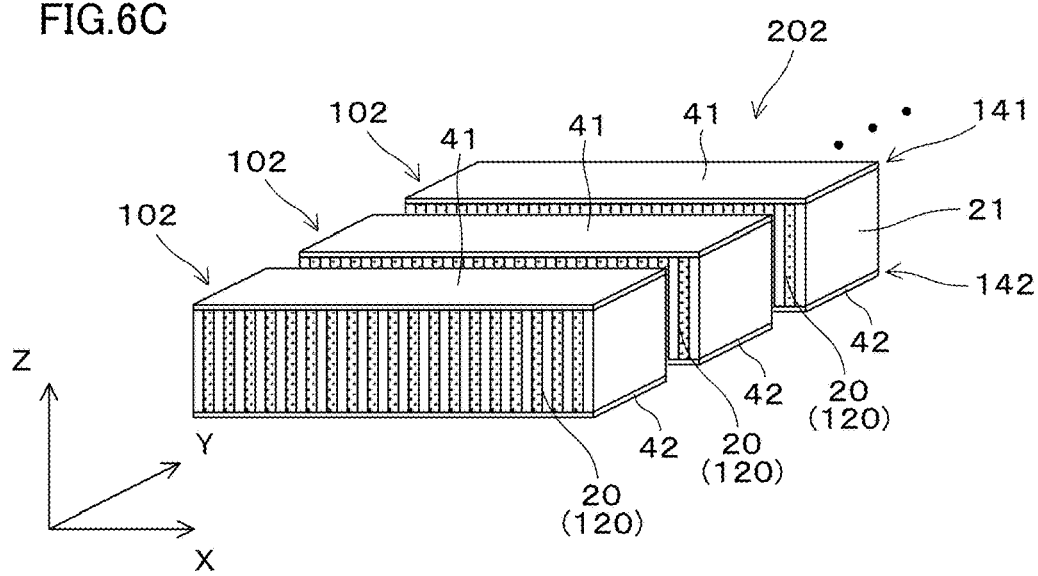

Finally, a plurality of piezoelectric elements 102 are obtained by dividing the piezoelectric element parent material 302 parallel to the Y-Z plane by a cutting machine or the like (see FIG. 6C). A large number of piezoelectric elements 102 obtained from one or more piezoelectric element parent materials 302 form the element assembly 202 illustrated in FIG. 2A etc. Note that the specific number of the three-dimensional structures 21 included in the compound body 282, which is the minimum unit for forming the piezoelectric elements 102, is about 10 to 20, for example. In addition, the piezoelectric element 102 corresponding to a single pixel of the sensor turns out to be a series of n pieces of the minimum-unit compound body 282 arranged in the X-direction in the specific example, and the specific number of the three-dimensional structures 21 included in the piezoelectric element 102 turns out to be 230 assuming that the element width in the X-direction is 4.6 mm and the three-dimensional structure period (W1+W2) is 20 µm, for example.

Figure 8:
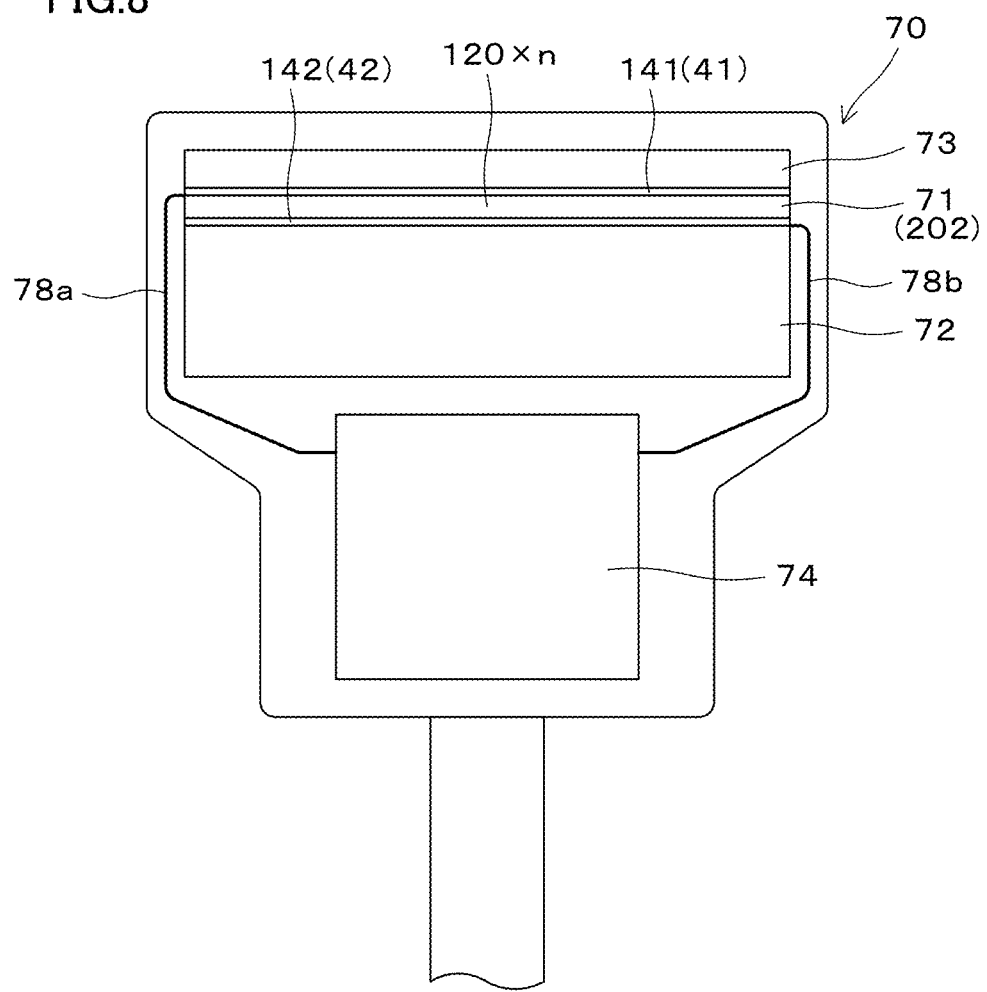
FIG. 8 is a conceptual view explaining a probe of an ultrasonic inspection apparatus having embedded therein the piezoelectric element illustrated in FIG. 2.

FIG. 8 is an explanatory diagram of a probe for an ultrasonic inspection apparatus or an ultrasonic sensor produced using the piezoelectric elements 102 illustrated in FIG. 1A or the like. The illustrated probe 70 has a vibration part 71 obtained from the element assembly 202 or the piezoelectric elements 102, a backing material 72 provided behind the vibration part 71, an alignment layer 73 provided in front of the vibration part 71, and a drive circuit 74 that causes the vibration part 71 to operate. A structure having the three-dimensional structure group 20 with a width of about 5 µm to 30 µm and an aspect ratio 4 or higher, as has been already described, is useful as the piezoelectric elements 102 for the probe. The element assembly 202 forming the vibration part 71 has a large number (n) of the compound piezoelectric element bodies 120 arranged laterally in the drawing, and comb-like electrodes 141 and 142 sandwiching the compound piezoelectric element body 120 from top and bottom. The comb-like electrode 141 on one hand is, for example, the positive electrode connected to a ribbon-like parallel wiring 78a in terms of individual ones of the first electrodes 41, and the comb-like electrode 142 on the other hand is, for example, the negative electrode connected to a ribbon-like parallel wiring 78b in terms of individual ones of the second electrodes 42. Both of the parallel wirings 78a and 78b, extending from the drive circuit 74, apply a voltage with a period corresponding to an ultrasonic wave on the unit probe or pixel (equivalent to the piezoelectric elements 102 illustrated in FIG. 1) corresponding to each channel, thereby generating ultrasonic vibration in a large number of the three-dimensional structures 21 included therein, and converting the ultrasonic vibration received by a large number of the three-dimensional structures 21 into a voltage signal.

Note that the backing material 72 prevents ultrasonic waves from being emitted backward of the vibration part 71. In addition, the alignment layer 73 has a role of suppressing reflection of ultrasonic waves that are incident to or emitted from the front of the vibration part 71.

Specific operations of the probe 70 are such that operations of transmitting ultrasonic waves performed within a period such as nanoseconds to microseconds and operations of receiving ultrasonic waves performed within a similar period are alternately repeated. When performing a transmitting operation, the drive circuit 74 receives a trigger signal from a control circuit which is not illustrated and causes each of the piezoelectric elements 102 forming the probe 70 to perform ultrasonic vibration with a predetermined delay time set therein. When performing a receiving operation, the drive circuit 74 receives voltage signals corresponding to reflection of ultrasonic waves detected in each of the piezoelectric elements 102, and performs synthesis of the signals with a predetermined delay time set in each of the piezoelectric elements 102. Accordingly, it becomes possible to control the wave front of ultrasonic waves and cause an ultrasonic wave of a desired vibration frequency to hit a point-like object in front of the probe 70, as well as selectively receiving an ultrasonic wave which has been reflected back from such a point-like object.

In the method for producing the piezoelectric elements 102 according to the first embodiment described above, although a plurality of plate-like precursor shapes 82a are fabricated on the bulk material 81 formed of Pb-based piezoelectric material in the first process, the size of the precursor shapes 82a is larger than the size of the three-dimensional structures 21 obtained in the finishing second process by an amount corresponding to the etching, whereby it becomes relatively easy to form the precursor shapes 82a without chipping or deterioration. Furthermore, the lateral width of the precursor shapes 82a is reduced to a predetermined value using an etching liquid in the subsequent second process, a plurality of the three-dimensional structures 21 having the target shape can relatively easily be obtained from the precursor shapes 82a, while avoiding damage due to fabrication.

In addition, the piezoelectric elements 102 produced by the producing method described above is obtained by reducing the width of the precursor shapes 82a to predetermined value using an etching liquid, with a surface 121a of the three-dimensional structures 21, which is contacting the filling part 31, being the surface finished by wet etching. As thus described, the piezoelectric elements 102 has relatively easily obtained a plurality of the three-dimensional structures 21 having the target shape, while avoiding damage due to fabrication. Therefore, the piezoelectric elements 102 can provide a probe having a deep and high columnar microstructure body with no deterioration of the piezoelectric constant and little deterioration due to processing.

EXAMPLES

The following table 1 lists examples of the method for producing a piezoelectric element. Note that examples 1 to 13 are listed in table 1.

TABLE 1

| | | Etching | | | | | | Cleaning | | |
|---|---|---|---|---|---|---|---|---|---|---|
| | | liquid | liquid state | amount of liquid | container | temperature | time | liquid | temperature | time |
| Example 1 | Process 1 | PT303 | new | 10 cc | glass-made petri | 30° C. | 40 min | water | 80 °C. | 40 min |
| | Process 2 | PT303 | new | 10 cc | glass-made petri | 30° C. | 55 min | water | 80 °C. | 35 min |
| | Process 3-1 | PT303 | new | 10 cc | glass-made petri | 30° C. | 65 min | | | |
| | Process 3-2 | PT303 | new | 10 cc | glass-made petri | 30° C. | 14 h | water | 80 °C. | 30 min |
| Example 2 | Process 1 | PT303 | new | 10 cc | glass-made petri | 30° C. | 40 min | water | 80 °C. | 40 min |
| | Process 2 | PT303 | new | 10 cc | glass-made petri | 30° C. | 55 min | water | 80 °C. | 35 min |

TABLE 1-continued

|  | | | | | | | | | | | |
|---|---|---|---|---|---|---|---|---|---|---|---|
|  | Process 3 | PT303 | new | 10 cc | glass-made petri | 30° C. | 15 h | water | 80 ° C. | 30 min |
| Example 3 | Process 1 | PT303 | new | 10 cc | glass-made petri | 30° C. | 30 min | water | 80 ° C. | 20 min |
|  | Process 2 | PT303 | new | 10 cc | glass-made petri | 30° C. | 30 min | water | 80 ° C. | 20 min |
|  | Process 3 | PT303 | Process 2 | 10 cc | glass-made petri | 30° C. | 30 min | water | 80 ° C. | 20 min |
|  | Process 4 | PT303 | new | 10 cc | glass-made petri | 30° C. | 14 h | water | 80 ° C. | 20 min |
| Example 4 | Process 1 | PT304 | new | 10 cc | glass-made petri | 30° C. | 30 min | water | 80 ° C. | 30 min |
|  | Process 2 | PT304 | new | 10 cc | glass-made petri | 30° C. | 30 min | water | 80 ° C. | 30 min |
|  | Process 3 | PT304 | new | 10 cc | glass-made petri | 30° C. | 15 h | water | 80 ° C. | 30 min |
| Example 5 | Process 1 | PT303 | new | 10 cc | Teflon container with glass plate | 30° C. | 40 min | water | 80 ° C. | 40 min |
|  | Process 2 | PT303 | new | 10 cc | Teflon container with glass plate | 30° C. | 55 min | water | 80 ° C. | 35 min |
|  | Process 3 | PT303 | new | 10 cc | Teflon container with glass plate | 30° C. | 15 h | water | 80 ° C. | 30 min |
| Example 6 | Process 1 | hydrochloric acid | new | 10 cc | Teflon container | 30° C. | 30 min |  |  |  |
|  | Process 2 | hydrochloric acid | new | 10 cc | Teflon container | 30° C. | 30 min |  |  |  |
|  | Process 3 | hydrochloric acid | new | 10 cc | Teflon container | 30° C. | 30 min |  |  |  |
| Example 7 | Process 1 | flounitric acid | new | 10 cc | Teflon container | 30° C. | 30 min | water | 80 ° C. | 30 min |
|  | Process 2 | hydrogen peroxide | new | 10 cc | Teflon container | 30° C. | 30 min | water | 80 ° C. | 30 min |
|  | Process 3 | nitric acid | new | 10 cc | Teflon container | 30° C. | 30 min | water | 80 ° C. | 20 min |
| Example 8 | Process 1 | PT306 | new | 10 cc | glass-made petri | 27° C. | 1 h |  |  |  |
|  | Process 2 | PT306 | new | 10 cc | glass-made petri | 27° C. | 1 h |  |  |  |
|  | Process 3 | PT306 | new | 10 cc | glass-made petri | 27° C. | 15 min |  |  |  |
| Example 9 | Process 1 | PT303 | new | 10 cc | glass-made petri | 27° C. | 14 h | water | 100 ° C. | 30 min |
|  | Process 2 | PT303 | new | 10 cc | glass-made petri | 27° C. | 14 h | water | 100 ° C. | 30 min |
|  | Process 3 | PT303 + nitric acid | new | 10 cc | glass-made petri | 27° C. | 5 min | water | 100 ° C. | 30 min |
|  | Process 4 | PT303 + nitric acid | new | 10 cc | glass-made petri | 27° C. | 5 min | water | 100 ° C. | 30 min |
| Example 10 | Process 1 | PT306 | new | 10 cc | glass-made petri | 27° C. | 1 h |  |  |  |
|  | Process 2 | PT306 | new | 10 cc | glass-made petri | 27° C. | 15 min |  |  |  |
| Example 11 | Process 1 | PT303 | new | 10 cc | Teflon container | 30° C. | 30 min | water | 80 ° C. | 30 min |
|  | Process 2 | PT303 | new | 10 cc | Teflon container | 30° C. | 30 min | water | 80 ° C. | 30 min |
| Example 12 | Process 1 | PT303 | new | 10 cc | PC container | 30° C. | 30 min | water | 80 ° C. | 30 min |
|  | Process 2 | PT303 | new | 10 cc | PC container | 30° C. | 30 min | water | 80 ° C. | 30 min |
| Example 13 | Process 1 | PT306 (20 times diluted solution) | new | 10 cc | glass-made petri | 27° C. | 1 h |  |  |  |

TABLE 1-continued

| | | Process 2 | PT306 (20 times diluted solution) | new | 10 cc | glass-made petri | 27° C. | 1 h |

| | | Ultrasonic cleaning | | | | Piezo-electric average width ($\mu$m) | Piezo-electric structure height ($\mu$m) | variation of width p-v ($\mu$m) | shape deformation | debris |
|---|---|---|---|---|---|---|---|---|---|---|
| | | liquid | frequency | temperature | time | | | | | |
| Example 1 | Process 1 | water | 45 kHz | 30° C. | 10 s | 35 | 405 | | | |
| | Process 2 | water | 45 kHz | 30° C. | 10 s | 25 | 476 | | | |
| | Process 3-1 | | | | | | | | | |
| | Process 3-2 | water | 45 kHz | 30° C. | 10 s | 7 | 453 | 1 | ◎ | ◎ |
| Example 2 | Process 1 | water | 45 kHz | 30° C. | 10 s | 35 | 485 | | | |
| | Process 2 | water | 45 kHz | 30° C. | 10 s | 25 | 476 | | | |
| | Process 3 | water | 45 kHz | 30° C. | 10 s | 15 | 453 | 10 | ◎ | ◎ |
| Example 3 | Process 1 | water | 40 kHz | 30° C. | 10 s | 40 | 490 | | | |
| | Process 2 | water | 40 kHz | 30° C. | 10 s | 30 | 480 | | | |
| | Process 3 | water | 40 kHz | 30° C. | 10 s | 25 | 475 | | | |
| | Process 4 | water | 40 kHz | 30° C. | 10 s | 10 | 480 | 10 | ◎ | ◎ |
| Example 4 | Process 1 | water | 45 kHz | 30° C. | 10 s | 30 | 380 | | | |
| | Process 2 | water | 45 kHz | 30° C. | 10 s | 20 | 370 | | | |
| | Process 3 | water | 45 kHz | 30° C. | 10 s | 10 | 360 | 10 | ◎ | ○ |
| Example 5 | Process 1 | water | 45 kHz | 30° C. | 10 s | 35 | 285 | | | |
| | Process 2 | | 45 kHz | 30° C. | 10 s | 28 | 275 | | | |
| | Process 3 | water | 45 kHz | 30° C. | 10 s | 15 | 185 | 10 | ○ | ◎ |
| Example 6 | Process 1 | | | | | 38 | 283 | | | |
| | Process 2 | water | | | | 28 | 278 | | | |
| | Process 3 | | | | | 20 | 270 | 10 | ○ | ◎ |
| Example 7 | Process 1 | | 45 kHz | 30° C. | 10 s | 50 | 500 | ←not deformed | | |
| | Process 2 | | 45 kHz | 30° C. | 10 s | 50 | 500 | ←not deformed | | |
| | Process 3 | | 45 kHz | 30° C. | 10 s | 50 | 500 | ←not deformed | ◎ | ◎ |
| Example 8 | Process 1 | | | | | 30 | 320 | | | |
| | Process 2 | | | | | 18 | 305 | | | |
| | Process 3 | | 45 kHz | 30° C. | 10 s | 10 | 300 | | ◎ | ◎ |
| Example 9 | Process 1 | water | 45 kHz | 30° C. | 60 s | 32 | 142 | | | |
| | Process 2 | water | 45 kHz | 30° C. | 60 s | 20 | 136 | | | |
| | Process 3 | | 45 kHz | 30° C. | 60 s | 15 | 125 | | | |
| | Process 4 | water | 45 kHz | 30° C. | 60 s | 10 | 120 | | ◎ | ◎ |
| Example 10 | Process 1 | | | | | 30 | 305 | | | |
| | Process 2 | | 45 kHz | 30° C. | 10 s | 26 | 300 | | ◎ | ◎ |
| Example 11 | Process 1 | | 45 kHz | 30° C. | 10 s | | | | | |
| | Process 2 | acetone | 45 kHz | 30° C. | 10 s | | | | Δ | Δ |
| Example 12 | Process 1 | water | 45 kHz | 30° C. | 10 s | | | | | |
| | Process 2 | water | 45 kHz | 30° C. | 10 s | | | | Δ | Δ |
| Example 13 | Process 1 | water | | | | 30 | 480 | | | |
| | Process 2 | | 45 kHz | 30° C. | 10 s | 10 | 450 | | ◎ | ◎ |

In the aforementioned table 1, "etching" refers to processing using fluoride, chloride, nitric acid, or mixed liquid thereof, and "cleaning" refers to hot water cleaning. In addition, ultrasonic cleaning using water was performed on all of the samples at room temperature.

With regard to the examples described above, the PMN-PT elements or the like after completion of etching, i.e., the etched product 182 were evaluated. The evaluated items were: (1) average lateral width of the three-dimensional structures 21 of the PMN-PT elements or the like ("piezoelectric structure average width ($\mu$m)"), (2) height or depth of the three-dimensional structures 21 of the PMN-PT element or the like ("piezoelectric structure height ($\mu$m)"), (3) whether or not the lateral width of the three-dimensional structures 21 varied depending on the location ("width variation P–V ($\mu$m)"), (4) whether or not the shape of the three-dimensional structures 21 deformed, and (5) whether or not debris remained in the three-dimensional structures 21.

With regard to shape deformation, size variation $\Delta L$ of the three-dimensional structures 21 in the lateral width direction or arrangement direction is measured using an SEM or an optical microscope. Variations of $\Delta L$ before and after wet etching are then compared to define $\Delta L_{before} - \Delta L_{after}$ = shape deformation value. "Double circle" indicates that the shape deformation value is equal to or smaller than 5 $\mu$m, "○" indicates that the shape deformation value is larger than 5 $\mu$m and equal to or smaller than 10 $\mu$m, "Δ" indicates that the shape deformation value is larger than 10 $\mu$m and equal to or smaller than 15 $\mu$m, and "x" indicates that the shape deformation value is larger than 15 $\mu$m. Note that, in the aforementioned measurement of $\Delta L$, 1000-times magnified KEYENCE optical microscope or SEM images were used. On this occasion, 10 points of the target site of the sample were measured, and $\Delta L$ were obtained from the degree of variation.

With regard to debris, the size of debris formed in a manner accompanying the three-dimensional structures 21 is measured using an SEM or an optical microscope. "Double circle" indicates that the size of debris is equal to or smaller than 3 μm, "○" indicates that the size of debris is larger than 3 μm and equal to or smaller than 6 μm, "Δ" indicates that the size of debris is larger than 6 μm and equal to or smaller than 10 μm, and "x" indicates that the size of debris is larger than 10 μm.

In examples 1 to 8 and 10 to 12, a PMN-PT substrate (product name "PMN-PT/lead magnesium niobate lead titanate") from Nihonkai Medical Co., Ltd. was used as the bulk material 81. Additionally, in example 9, a PIN-PMN-PT substrate (product name "PIN-PIN-PMN" (Lead Indium Niobate-Lead Magnesium Niobate-Lead Titanate) from CTG Advanced Materials, LLC was used as the bulk material 81 and, in example 13, a PZT substrate from Lead Techno Co., Ltd. was used as the bulk material 81. Here, PMN-PT has a composition of PbO—MgO—$Nb_2O_5$—$TiO_2$ (including 69.9 to 70.6 mass % lead oxide (II) (PbO), 2.5 to 3.1 mass % magnesium oxide (MgO), 16.8 to 20.3 mass % niobium oxide (V) ($Nb_2O_5$), and 6.7 to 10.1 mass % titanium oxide (IV) ($TiO_2$), specifically). PIN-PMN-PT has a composition of PbO—$In_2O_3$—$TiO_2$—$Nb_2O_5$—MgO. In addition, PZT has a composition of Pb $(Zr_xTi_{1-x})$ $O_3$. The substrate size is, in all of examples 1 to 11, 20 mm×20 mm×thickness 0.5 mm, and the 20 mm×20 mm plane is oriented to (001).

Figure 9:
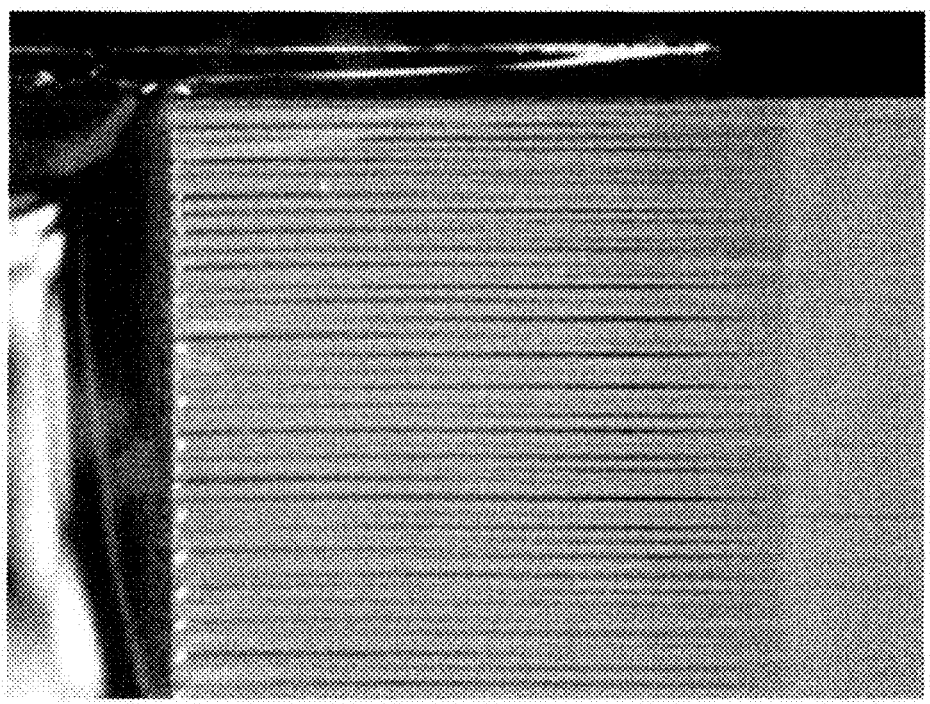
FIG. 9 is an explanatory diagram of a specific precursor formed into a precursor shape.

Next, using Dicer DAD 3350 and a blade (model number Z09-SD4000-Y1-90 72x0.025Alx40) manufactured by DISCO Corporation, incision was made on the bulk material such as PMN-PT so that the micro shapes 121 had a lateral width of 50 μm. The groove width of the incision had turned out to be 25 μm. Note that the vertical width of the incision coincided with the thickness of the bulk material 81 in the Z-direction, with the groove penetrating through the bulk material 81, and the depth of the incision was made close to the thickness of the bulk material 81 in the Y-direction. FIG. 9 illustrates a specific example of the precursor 82 having formed therein the precursor shape 82a formed of the micro shapes 121. In the drawing, each of the micro shapes 121 extends horizontally, and a large number of micro shapes 121 vertically overlap with each other.

Next, the precursor 82 was subjected to wet etching. In table 1, etching liquids "PT303", "PT304" and "PT306" indicate the product names of the etching liquid "Pure Etch PT303," "Pure Etch PT304," and "Pure Etch PT306" manufactured by HAYASHI PURE CHEMICAL IND., LTD. Here, Pure Etch PT303 is a water solution containing 0.1 to 3.90 weight % ammonium fluoride $NH_4F$ and 10% or less hydrogen chloride HCL. Pure Etch PT304 is water solution containing 4.1 to 10 weight % ammonium fluoride $NH_4F$ and 10% or less hydrogen chloride HCL. Pure Etch PT306 is a water solution containing 4.1 to 10 weight % ammonium fluoride $NH_4F$ and 10% or less nitric acid $HNO_3$. In addition, "PT303+nitric acid" indicates a mixture of 5 mass % pure nitric acid in Pure Etch PT303. A fresh liquid was used for the etching liquid in each step, except for example 3. Subsequently, the etched product 182 was obtained with an underlying layer being exposed by separating, in a case where there existed any of, the passive layer 84, using cleaning operation including hot water processing. With regard to etching, the distance or depth of progress of etching is determined in the first 30 minutes and subsequently, the passive layer 84 of Pb fluoride or chloride covers the surface, whereby the progress of etching slows down. In a case where the passive layer 84 is uniformly formed, the passive layer 84 separates by subsequent cleaning operation and a mirror face formed of PMN-PT or the like appears as the surface 121a. Note that, in a case where the passive layer 84 is not uniformly formed, the surface 121a formed of PMN-PT or the like obtained after cleaning turns out to be uneven. In order to form the passive layer 84 uniformly, it suffices to delay the progress of etching and to prolong the etching time. Particularly when performing wet etching including a plurality of steps, etching in the last step is supposed to determine the surface roughness of the element and therefore the etching time is preferred to be prolonged. What is more desirable is to use a mixed liquid of ammonium fluoride and nitric acid as the etching liquid. In such a case, etching may be smoothly performed with the passive layer 84 not being formed and therefore it is desirable to use ammonium fluoride and nitric acid for suppressing formation of a passive layer.

In examples 1 to 10 and 13, glass was used for the container 91 or the supporting members 93a and 93b for wet etching. In other words, a glass-made petri or a glass plate was used. Causing glass to contact an etching liquid when performing etching allows for preventing the shape of the micro shapes 121 from deforming. It has been found that non-existence of glass when performing etching accelerates progress of etching, whereby the outline of the micro shapes 121 at an early stage significantly deforms, making it difficult to form the three-dimensional structures 21. Note that, in examples 11 and 12, etching was performed using a polytetrafluoroethylene container or a PC (polycarbonate) container with no glasses included therein.

Figure 10A:
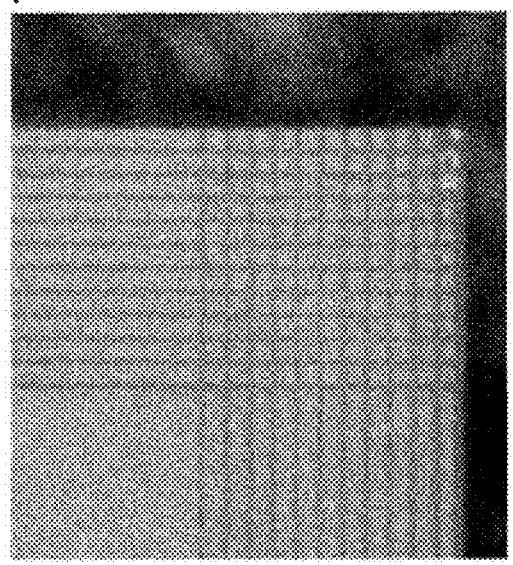
FIGS. 10A to 10C are explanatory diagrams of a condition of wet etching.
Figure 10B:
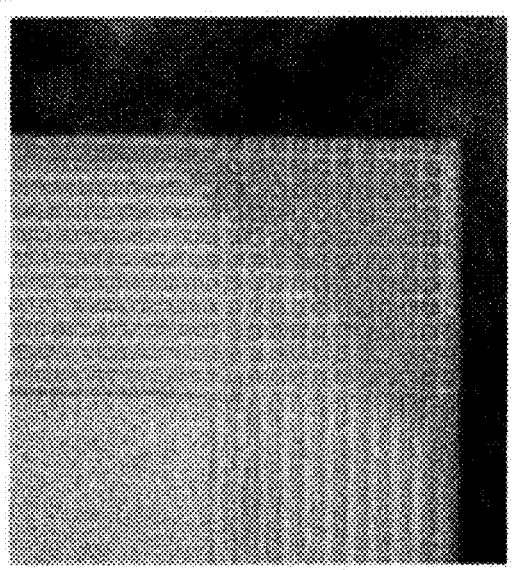
Figure 10C:
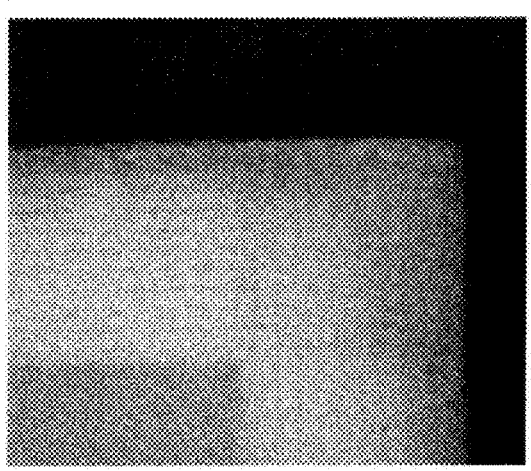

FIGS. 10A to 10C are explanatory diagrams of etching for forming the passive layer 84, illustrating an example of observation using an optical microscope. FIG. 10A illustrates a state before wet etching, in which the groove 51 is periodically formed by a large number of parallel dicing iterations and a large number of parallel dicing iterations perpendicular thereto, and the plate-like or wall-like micro shape 121 and the columnar micro shape 121 are formed on the surface of PMN-PT or the like which is the bulk material 81. FIG. 10B illustrates a state after etching under a relatively low temperature at which glass is caused to contact the etching liquid. Specifically, etching was performed for 17 hours at 38° C. In such a case, although the groove 51 has been broadened due to dicing, there remains the micro shapes 121 so as to maintain the shape. FIG. 10C illustrates a state after etching at a relatively low temperature, with glass being kept from contacting the etching liquid. In such a case, the micro shapes 121 have disappeared.

In addition, as a result of performing experiments in various conditions, it was found that the initial temperature of wet etching was desired to be at low temperature (31° C. or less, specifically). In a case where the temperature of the etching liquid is too high, the etching progresses even when letting the glass contact the etching liquid, thereby strengthening the trend of deformation of the micro shape 121. However, it was confirmed that performing etching once at a low temperature (31° C. or lower) for a short time (30 minutes, for example) and forming the passive layer 84 at the time point made the shape of the micro shape 121 difficult to deform even the temperature was raised thereafter. Although performing the latter half of the etching at a high temperature (31° C. or higher) causes the progress of etching to slow down with the passive layer 84 being a barrier, the effect of uniformly forming the passive layer 84 is promoted. As a result, the surface precision of the surface 121a of PMN-PT or the like obtained after cleaning became good.

Figure 11A:
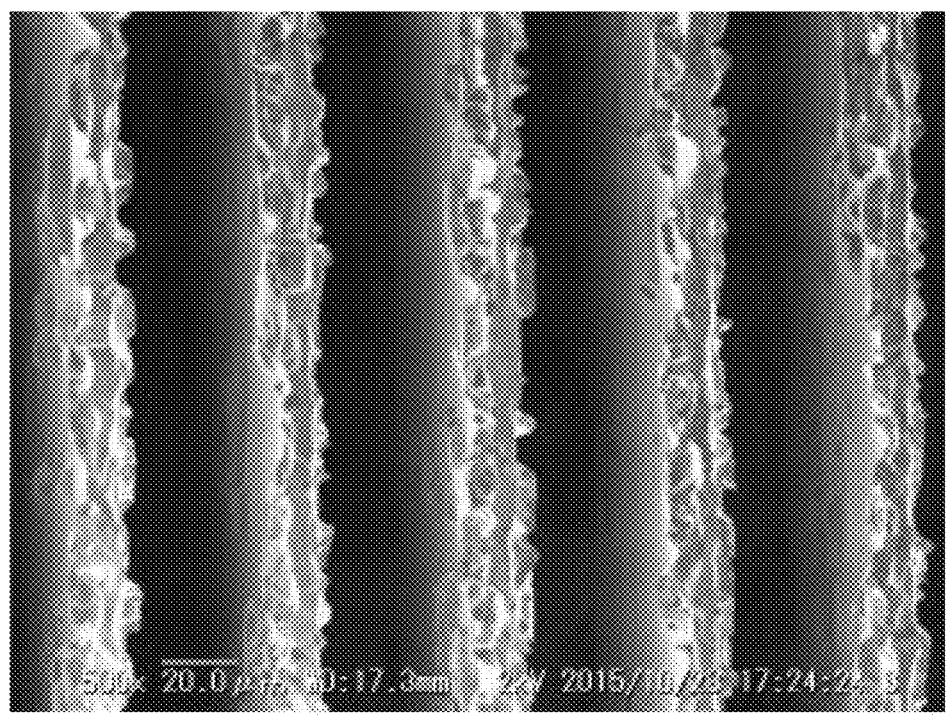
FIG. 11A is an explanatory diagram of an etched product after wet etching.
Figure 11B:
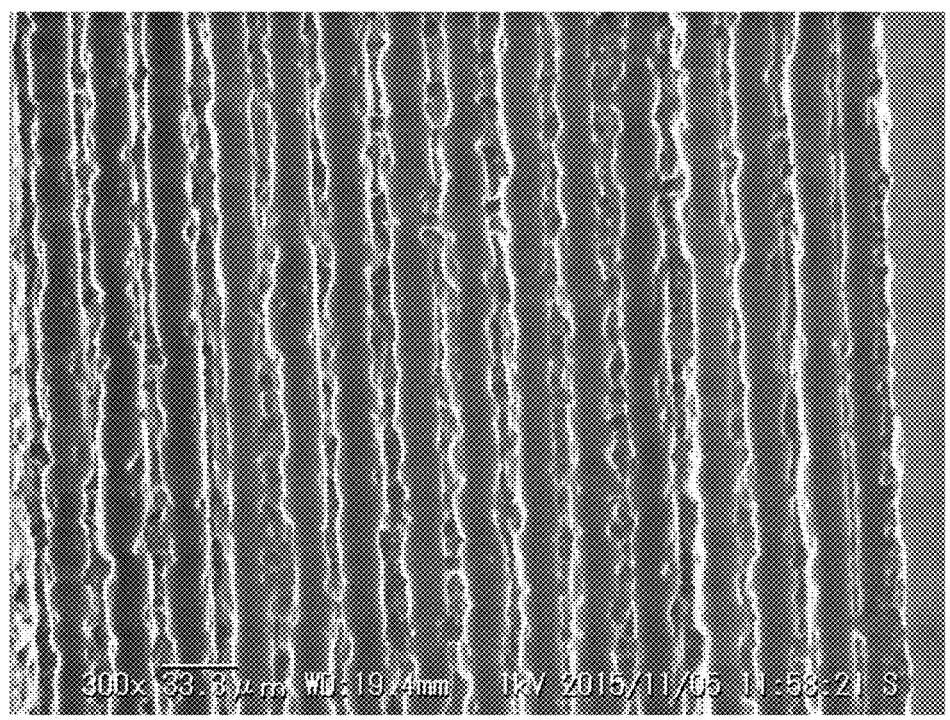
FIG. 11B is an explanatory diagram after epoxy filling.

FIG. 11A is an explanatory diagram of an SEM image of a group of the three-dimensional structures 21 in the etched product 182. In the drawing, each of the three-dimensional structures 21 is white and extending vertically, with a large number of the three-dimensional structures 21 aligning horizontally separated from each other. It is possible to evaluate the thickness of the three-dimensional structures 21 etc. from the SEM image. Note that FIG. 11B is an SEM image illustrating the compound body 282 obtained by filling epoxy resin between the three-dimensional structures 21.

Figure 12:
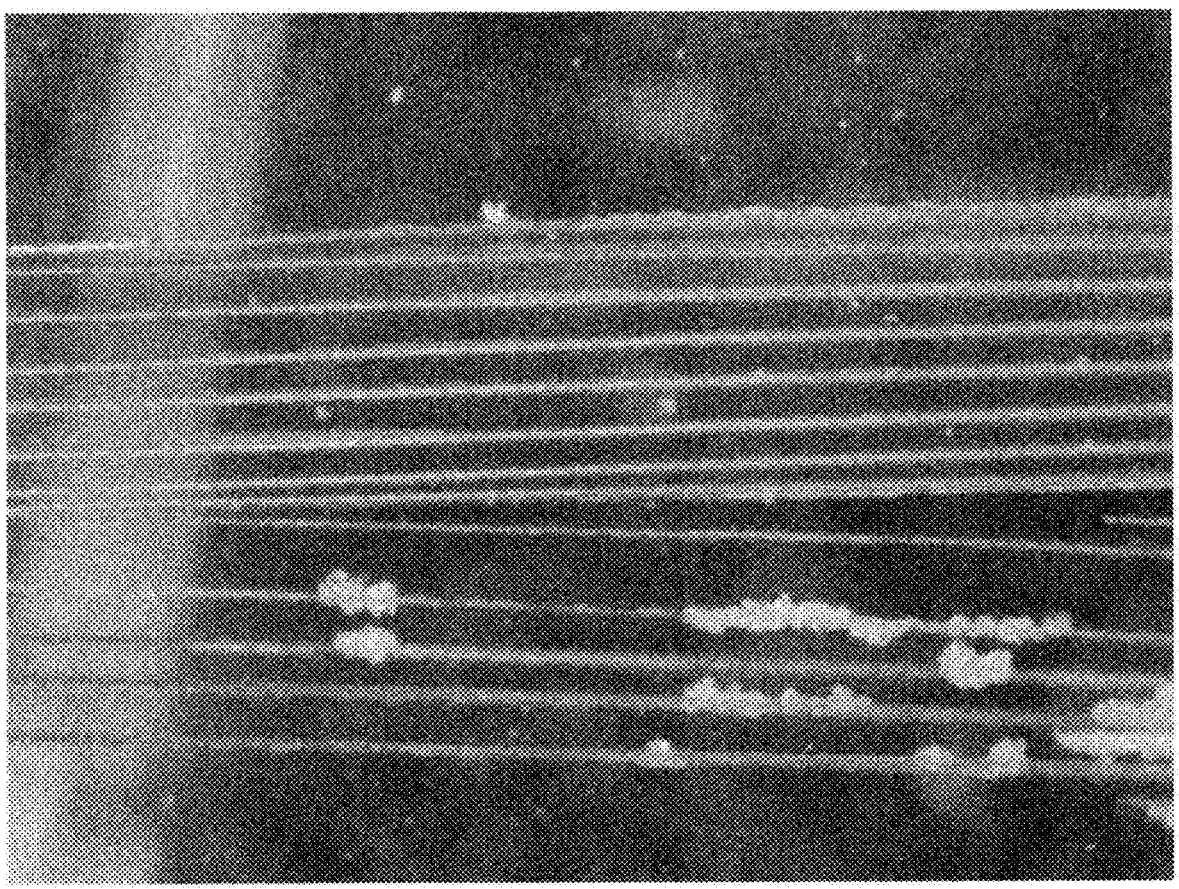
FIG. 12 is an explanatory diagram of debris formed in association with a three-dimensional structure.

FIG. 12 is an optical microscope image explaining evaluation of the size of debris. As illustrated, in a case where irregular particle-like debris are formed in a part of the three-dimensional structures 21, there is a possibility that, when subsequently raising the array density of the three-dimensional structures 21 across the resin adhesive material 61, the interval between the three-dimensional structures 21 may not be narrowed due to obstruction by the debris.

Upon completion of etching, the structure of line and space is produced by filling epoxy resin. Cemedine EP-007 was used as an epoxy resin. The employed curing condition of the epoxy resin was 12 hours at room temperature and subsequently 3 hours at 50° C. As a result, the groove width or interval between the three-dimensional structures 21, i.e., the width of the filling part 31 turned out to be 6 µm, for example. In order to adjust the groove width, the viscosity of the epoxy resin was adjusted. The lateral width between the three-dimensional structures 21 formed of PMN-PT or the like was 15 µm, the width or thickness of the epoxy resin being was 10 µm, and a structure was obtained in which the both appear repeatedly and alternately.

Polishing was performed on the compound body 282 filled with the epoxy resin, whereby the compound piezoelectric element body 120 including the three-dimensional structure group 20 was obtained. Polishing on the compound body 282 was performed using a polishing machine of MUSASHINO DENSHI. Co., LTD. The initial thickness was 500 µm. The compound body 282 was thinned to a thickness of 150 µm by polishing one side at a time with 9 µm abrasive grains. Subsequently, the thickness became 130 µm with 3 µm abrasive grains, and finally down to a thickness of 120 µm with 0.5 µm abrasive grains. The load when performing polishing was 0.4 kg/10 mm². The rotation speed of the polishing plate was 120 rpm.

Figure 13A:
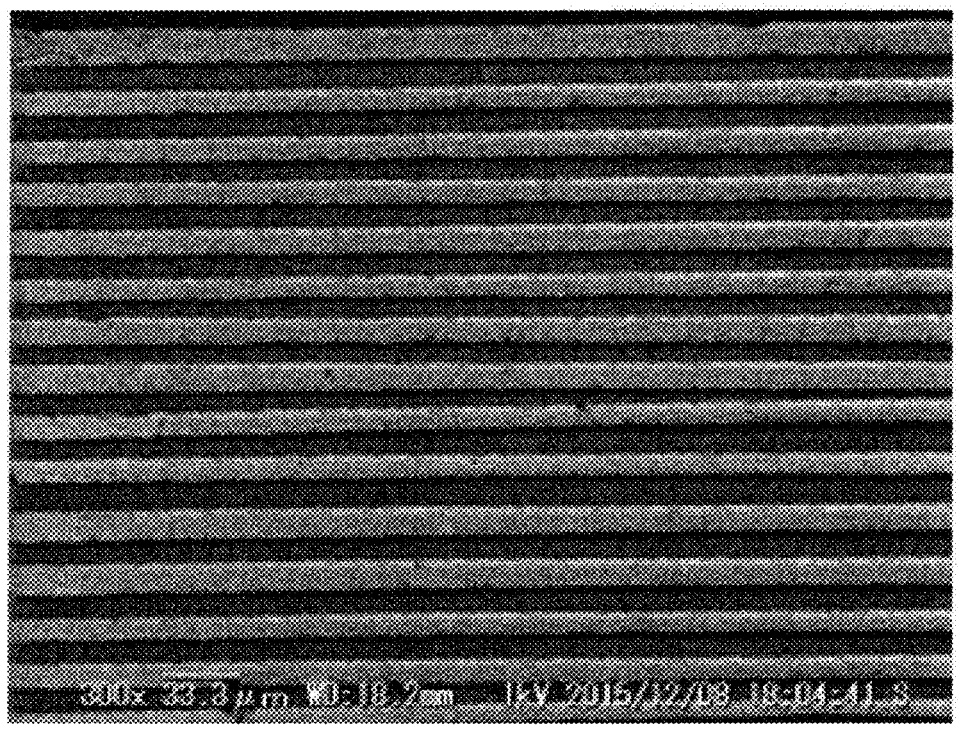
FIG. 13A is an explanatory diagram of the compound body after polished.
Figure 13B:
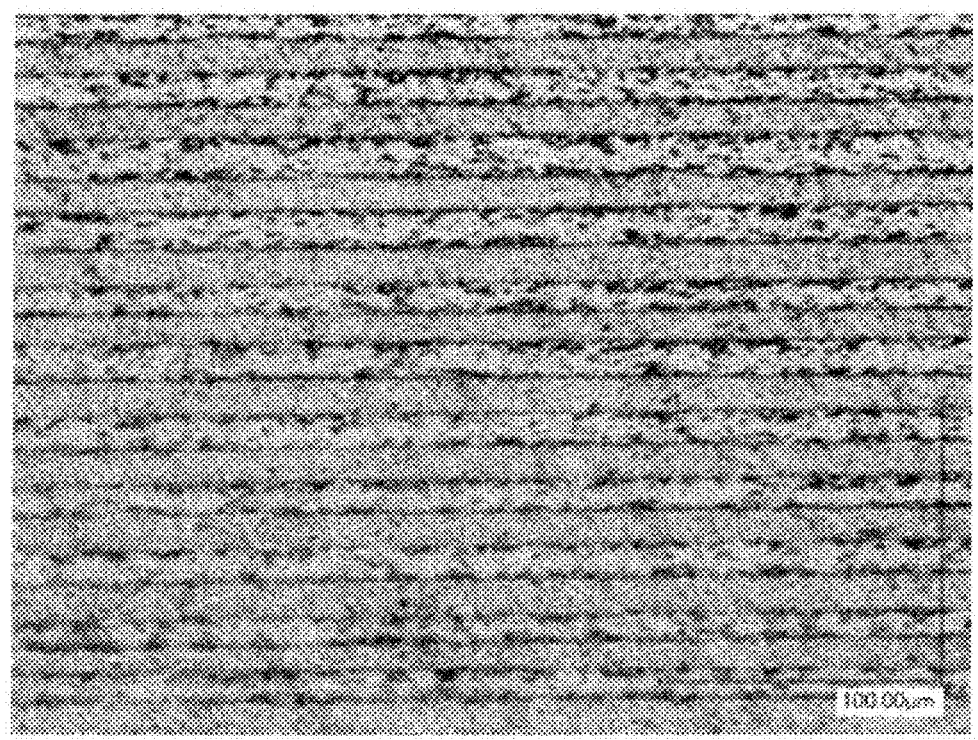
FIG. 13B is an explanatory diagram after electrode formation.

FIG. 13A is an SEM image explaining the top surface 21b of the compound body 282 after polished with 9 µm abrasive grains, with the (001) plane exposed in each of the three-dimensional structures 21 extending in the lateral direction. FIG. 13B is an SEM image explaining the state where the electrode layer 241 has been formed on the top surface 21b of FIG. 13A.

In the compound body 282 after polishing illustrated in FIG. 13A, each of the three-dimensional structures 21 extends horizontally, and the filling part 31 with a uniform thickness exists between adjacent three-dimensional structures 21. The thickness of the filling part 31 is kept generally constant regardless of the position in the vertically direction.

The electrode layers 241 and 242 were formed, and the piezoelectric element parent material 302 was produced by forming a 50 nm Cr film by sputtering and forming a 200 nm Au film by sputtering, as illustrated in FIG. 13B, at a stage in which pattern surfaces 28a and 28b of the compound body 282 had been polished and the compound piezoelectric element body 120 of an appropriate size was obtained.

Second Embodiment

In the following, a method for producing a piezoelectric element of a second embodiment will be described. The production method of the second embodiment is a partial modification of the production method of the first embodiment, and therefore items which are not explained in particular are similar to those of the production method of the first embodiment.

Figure 14A:
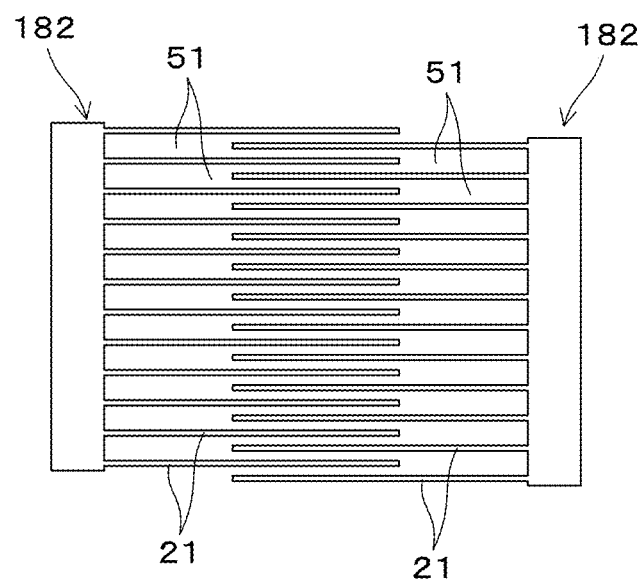
FIGS. 14A and 14B are explanatory diagrams of a production method of a second embodiment.
Figure 14B:
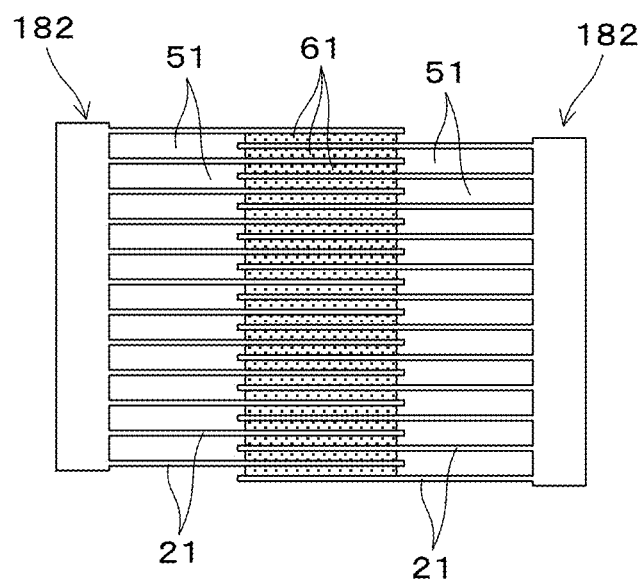

FIG. 14A is an explanatory diagram of a state where two units of the etched product 182 similar to that illustrated in FIG. 5A are prepared and arranged in the three-dimensional structures 21 so as to engage with each other. FIG. 14B illustrates a state where the resin adhesive material 61 is filled between adjacent three-dimensional structures 21. In a specific production example, the width or interval of the groove 51 formed by dicing was set to 25 µm, and the lateral width of the micro shape 121 was set to 50 µm. Subsequently, the width or interval of the groove 51 after etching was set to 65 µm, and the lateral width of the three-dimensional structures 21 was set to 10 µm. Therefore, in a state where the three-dimensional structures 21 are inserted in a manner shifted from each other as illustrated in FIG. 14A, the width or interval of the groove 51 has become 27.5 µm and the lateral width of the three-dimensional structures 21 has become 10 µm. Furthermore, in a state where the resin adhesive material 61 is filled as illustrated in FIG. 14B, the width or interval of the groove 51 narrows due to surface tension of the resin adhesive material 61. The thickness of the resin adhesive material 61 depends on the viscosity or the like of the resin adhesive material 61.

The approach of the second embodiment is advantageous in that the width of the groove 51 or the thickness of the resin adhesive material 61 can be narrowed to a certain extent even when the flexibility is low in a case where the thickness of the three-dimensional structures 21 is thick or the height is low.

Third Embodiment

In the following, a method for producing a piezoelectric element of a third embodiment will be described. The production method of the third embodiment is a partial modification of the production method of the first embodiment, and therefore items which are not explained in particular are similar to those of the production method of the first embodiment.

Figure 15A:
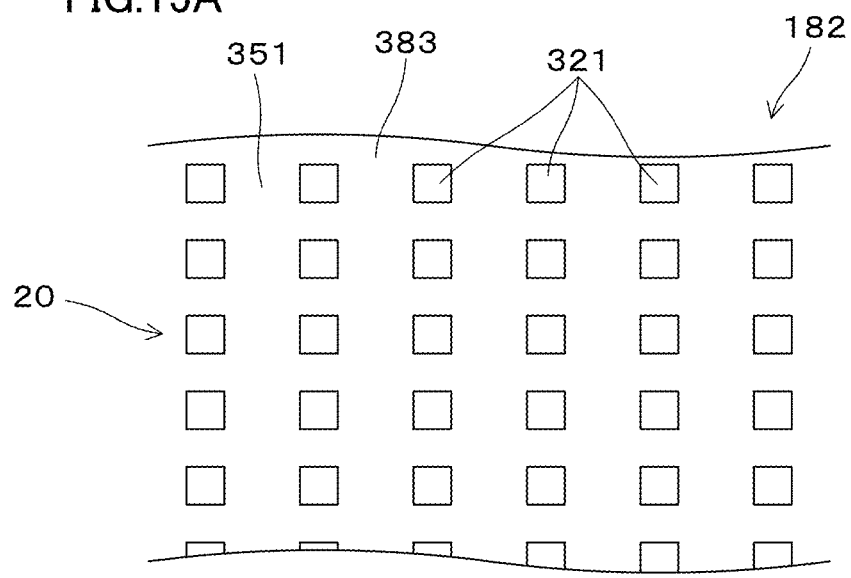
FIGS. 15A and 15B are a plan view and a side view of an etched product obtained by the production method of a third embodiment.
Figure 15B:
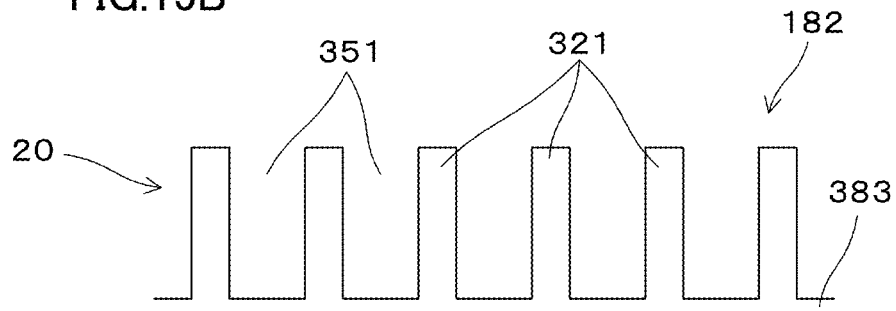

In the case of the etched product 182 illustrated in FIGS. 15A and 15B, a product with a large number of three-dimensional structures 321 provided on lattice points over a substrate 383 was obtain, as a result of performing a large number of parallel dicing iterations at regular intervals and a large number of parallel dicing iterations at regular intervals perpendicular thereto. Each of the three-dimensional structures 321 has a shape of a quadratic prism, with a surrounding groove 351 spreading in a lattice-like manner.

Figure 16:
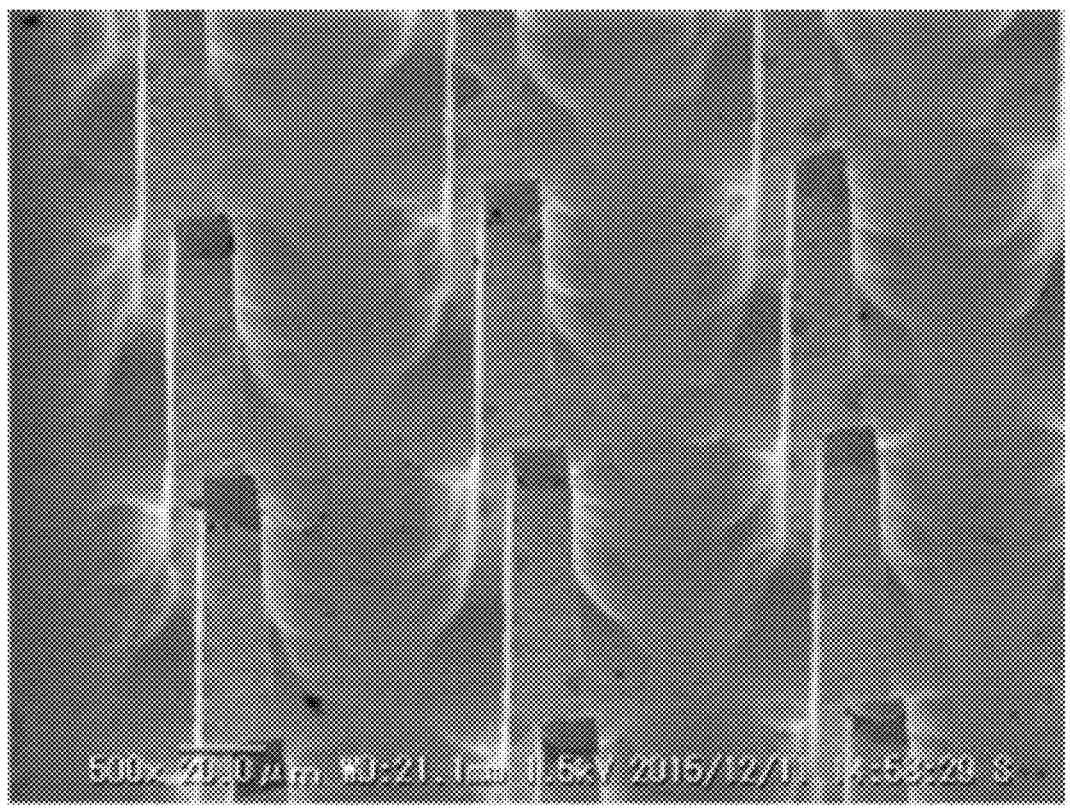
FIG. 16 is an explanatory diagram of a microstructure of a specific example of fabrication.

FIG. 16 is an SEM image in a specific production example. A large number of the quadratic-prism-like three-dimensional structures 321 are arranged on two-dimensional lattice points. Although the three-dimensional structures 321 are slightly thick at the root side close to the substrate 383, they are homogenously sized as a whole.

In the case of the etched product 182 illustrated in FIGS. 15A and 15B, the groove 351 can be filled with the resin adhesive material 61. On this occasion, it is possible to cause the three-dimensional structures 321 to bend and to arrange in close proximity each other, in a case where the three-dimensional structures 321 are high and long. After having been arranged in close proximity, filling of epoxy allows for producing a shape with piezoelectric material columns formed of PMN-PT or the like, i.e., the three-dimensional structure 321 being densely arranged with a 10 μm pitch. Subsequently, a piezoelectric element body can be obtained by cutting the shape into a required thickness and polishing it.

Fourth Embodiment

In the following, a method for producing a piezoelectric element of a fourth embodiment will be described. The production method of the fourth embodiment is a partial modification of the production method of the first embodiment, and therefore items which are not explained in particular are similar to those of the production method of the first embodiment.

Figure 17A:
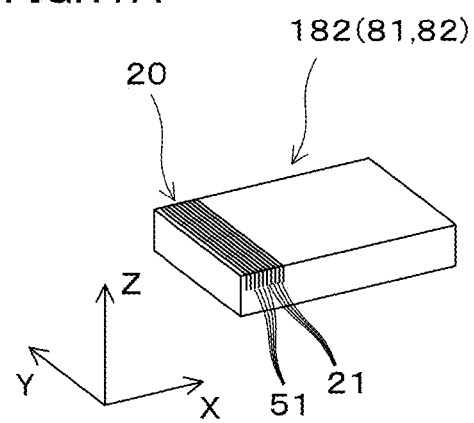
FIGS. 17A to 17C are explanatory diagrams of a production method of a fourth embodiment.

As illustrated in FIG. 17A, there is prepared the flat-plate-like bulk material 81, and a large number of grooves 51 are formed by dicing at regular intervals on one end thereof (left side of the drawing) so as to become the precursor 82. On this occasion, the width of the grooves 51 is set to 50 μm, for example, and the width of the wall therebetween is set to 50 μm. Subsequently, wet etching is performed on the precursor 82 so as to obtain the first etched product 182 with the width of the grooves 51 being 75 μm and the width of the wall being 25 μm. The first etched product 182 has formed thereon the three-dimensional structure group 20 including a large number of the three-dimensional structures 21. Performing similar processing results in a second etched product 182'. In other words, the precursor 82 of the second etched product 182' also has formed thereon the three-dimensional structure group 20 with the width of the grooves 51 being 75 μm and the width of the wall being 25 μm.

Figure 17B:
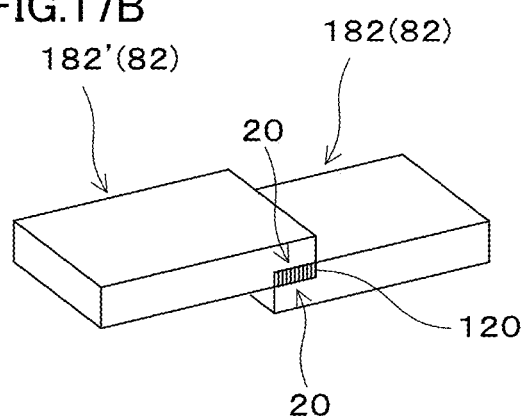

Subsequently, as illustrated in FIG. 17B, the first etched product 182 and the second etched product 182' are piled so that the three-dimensional structure groups 20 engage with each other. On this occasion, filling the grooves 51 formed between the three-dimensional structure groups 20 of the first etched product 182 with epoxy resin and curing the epoxy resin after the piling causes the compound piezoelectric element body 120 to be formed in the part where the three-dimensional structure groups 20 engage with each other.

Figure 17C:
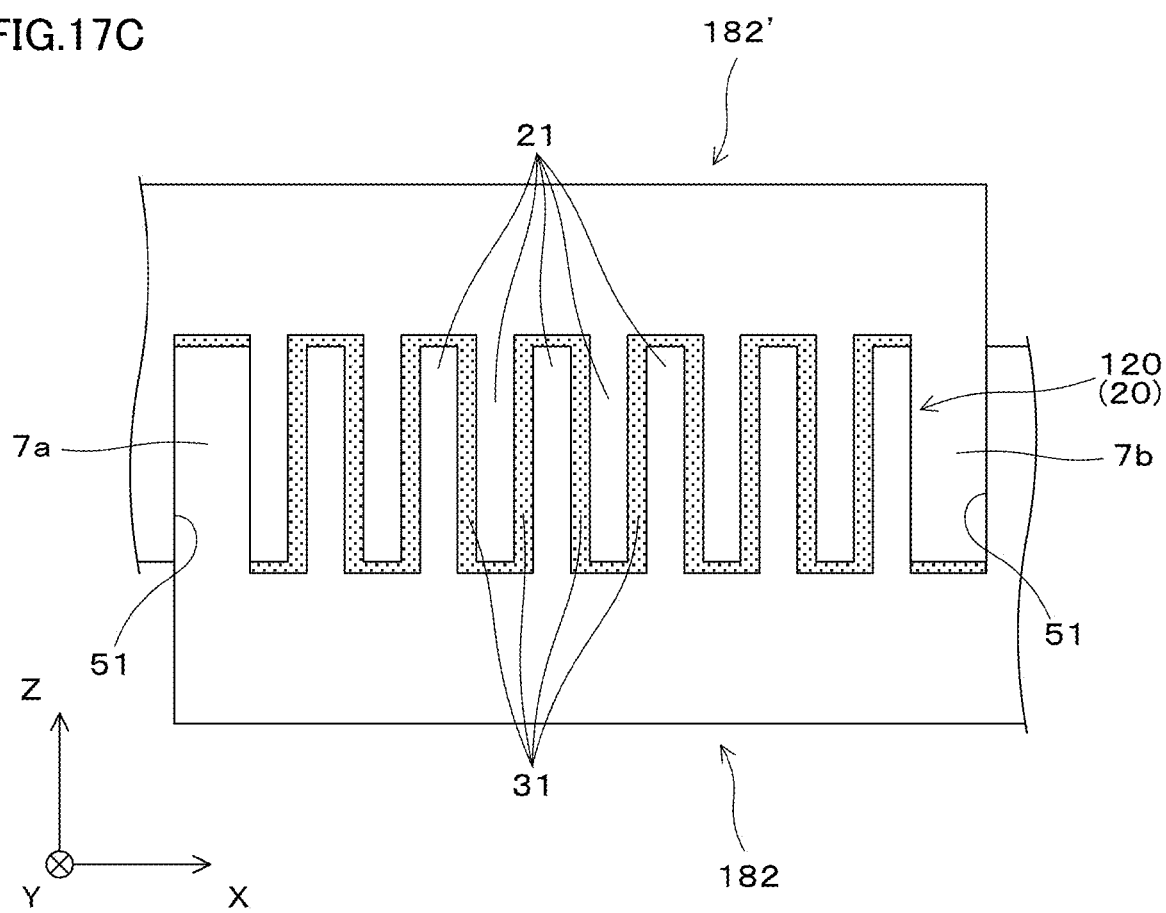

FIG. 17C is a cross-sectional view explaining the part where the three-dimensional structure groups 20 engage with each other in a enlarged manner. As apparent from the drawing, the three-dimensional structures 21 are arranged at regular intervals, the gap thereof being filled with the filling part 31.

Note that, a positioning part 7a is formed at the end of the three-dimensional structure group 20 provided in the first etched product 182, and a positioning part 7b is also formed at the end of the three-dimensional structure group 20 provided in the second etched product 182'. Although both of the positioning parts 7a and 7b have a shape similar to the three-dimensional structures 21, their lateral width takes a value close to the width of the grooves 51, and therefore they engage with the grooves 51. Accordingly, the first etched product 182 and the second etched product 182' align in the lateral direction of the page surface, and the alignment in the vertical direction is also allowed. According to the production method of the present embodiment, interval between the three-dimensional structures 21 included in the compound piezoelectric element body 120 becomes more uniform.

Figure 18A:
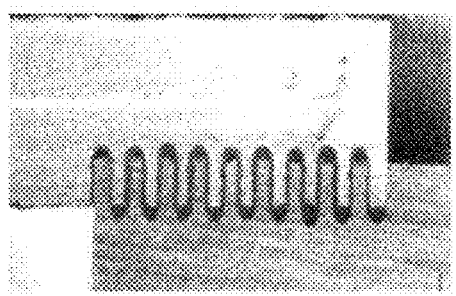
FIGS. 18A and 18B are explanatory diagrams of the obtained compound piezoelectric element body.
Figure 18B:
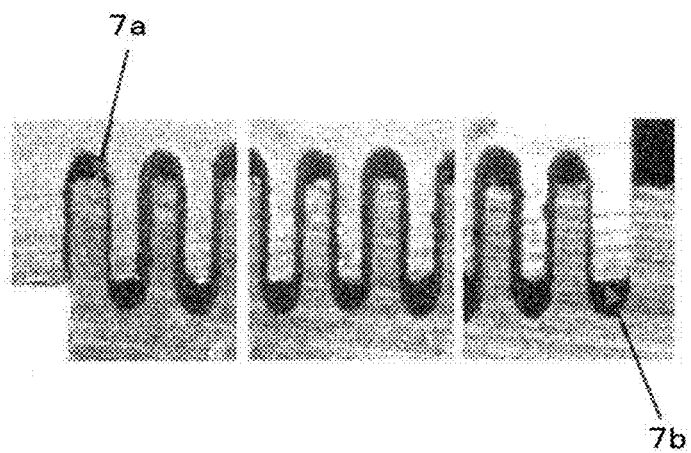

FIG. 18A is an SEM image of a cross-section at an intermediate stage in the specific production example of the compound piezoelectric element body 120, and FIG. 18B is a partial enlarged image of the compound piezoelectric element body 120 before completion. Note that the production condition of the three-dimensional structures 21 in this case is identical to that of example 10 of table 1.

Although a method for producing the piezoelectric element 102 according to embodiments has been explained above, the method for producing a piezoelectric element according to the present invention is not limited thereto. For example, specific examples of lateral width, depth length, and height (or depth) of the three-dimensional structures 21 and 321 are merely illustrative, and may be arbitrarily set within the scope defined in the claims.

Figure 19:
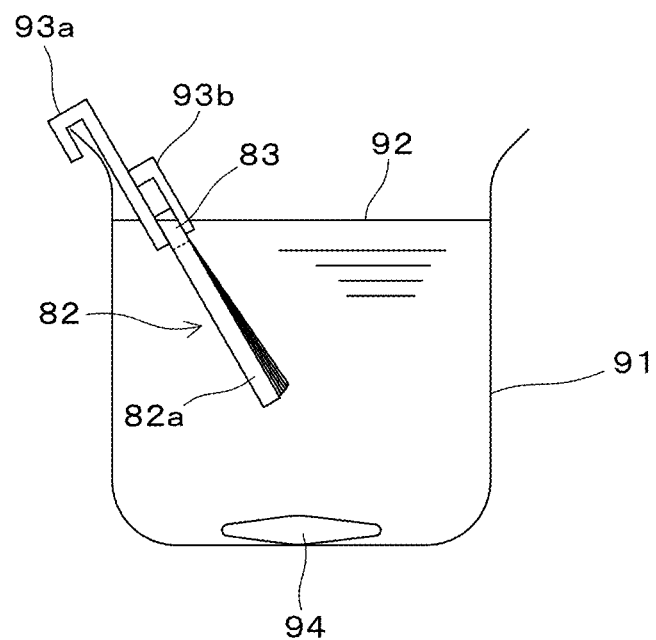
FIG. 19 is an explanatory diagram of a variation of the wet etching process.

Additionally, as illustrated in FIG. 19, the micro shape 121 or the three-dimensional structure 21 can also be obtained by suspending the precursor 82 in the etching liquid 92 stored in the glass-made container 91, and stirring the etching liquid 92 with the rotor 94.

The invention claimed is:

1. A method for producing a piezoelectric element including a three-dimensional structure group having a plurality of three-dimensional structures formed in a plate-like or columnar shape with a width of 30 μm or less and a height of 80 μm or more, the method comprising:
   a first process of fabricating a plurality of plate-like or columnar precursor shapes on a bulk material formed of a Pb-based piezoelectric material, wherein the plurality of plate-like or columnar precursor shapes is fabricated by cutting the bulk material to form grooves; and
   a second process of reducing the width of the precursor shape to a predetermined value using an etching liquid.

2. The method for producing a piezoelectric element according to claim 1, wherein the precursor shape is formed to have a width of 80 μm or less and a height of 80 μm or more.

3. The method for producing a piezoelectric element according to claim 1, wherein, in the second process, the surface of the precursor shape is etched with an etching liquid containing fluoride.

4. The method for producing a piezoelectric element according to claim 3, wherein the fluoride is ammonium fluoride.

5. The method for producing a piezoelectric element according to claim 1, wherein, in the second process, the surface of the precursor shape is etched with an etching liquid containing chloride or nitric acid.

6. The method for producing a piezoelectric element according to claim 1, wherein, when performing etching in the second process, glass is caused to contact the etching liquid simultaneously.

7. The method for producing a piezoelectric element according to claim 1, wherein resin having a predetermined viscosity is filled between a plurality of the three-dimensional structures, and an interval between a plurality of the three-dimensional structures is adjusted.

8. The method for producing a piezoelectric element according to claim 7, wherein the interval between a plurality of the three-dimensional structures is adjusted using surface tension that occurs in accordance with viscosity of the resin filled between a plurality of the three-dimensional structures.

9. The method for producing a piezoelectric element according to claim 1, being used as a probe of an ultrasonic inspection apparatus.

10. The method for producing a piezoelectric element according to claim 1, wherein an interval between a plurality of the three-dimensional structures is adjusted by bending the three-dimensional structures.

11. A piezoelectric element comprising a three-dimensional structure group having a plurality of three-dimensional structures formed in a plate-like or columnar shape, and a filling part that fills a gap in the three-dimensional structure group, the piezoelectric element being embedded in a probe of an ultrasonic inspection apparatus, wherein:

the three-dimensional structure is formed by cutting a bulk material formed of a Pb-based piezoelectric material to form grooves, and a surface of the grooves, which is contacting the filling part, is a surface finished by wet etching.

12. The piezoelectric element according to claim 11, wherein the three-dimensional structure has a width of 30 μm or less and a height of 80 μm or more.

13. The piezoelectric element according to claim 12, wherein the plurality of three-dimensional structures included in the three-dimensional structure group are arranged at an interval of 30 μm or less.

* * * * *